United States Patent
Ihs et al.

(10) Patent No.: US 8,228,222 B2
(45) Date of Patent: Jul. 24, 2012

(54) D-CLASS DIGITAL AMPLIFIER CONFIGURED FOR SHAPING NON-IDEALITIES OF AN OUTPUT SIGNAL

(75) Inventors: Hassan Ihs, Montpellier (FR); Christian Dufaza, Saint Pargoire (FR)

(73) Assignees: Universite de Provence Aix-Marseillei (FR); Centre National de la Recherche Scentifique (FR); Primachip SAS (FR)

( * ) Notice: Subject to any disclaimer, the term of this patent is extended or adjusted under 35 U.S.C. 154(b) by 40 days.

(21) Appl. No.: 12/969,449

(22) Filed: Dec. 15, 2010

(65) Prior Publication Data
US 2011/0148677 A1   Jun. 23, 2011

Related U.S. Application Data

(63) Continuation-in-part of application No. PCT/FR2009/000715, filed on Jun. 16, 2009.

(30) Foreign Application Priority Data

Jun. 16, 2008 (FR) .................................... 08 03348
Jun. 16, 2008 (FR) .................................... 08 03350

(51) Int. Cl.
*H03M 3/00* (2006.01)
(52) U.S. Cl. ........................ 341/143; 330/10; 330/291
(58) Field of Classification Search .................. 341/143; 330/10, 291, 251, 149, 136, 118
See application file for complete search history.

(56) References Cited

U.S. PATENT DOCUMENTS

| | | | |
|---|---|---|---|
| 5,777,512 A | 7/1998 | Tripathi et al. | |
| 6,255,977 B1 | 7/2001 | Jelonnek et al. | |
| 6,373,334 B1 | 4/2002 | Melanson | |
| 6,646,502 B1 * | 11/2003 | Kruiskamp | 330/10 |
| 6,754,287 B2 * | 6/2004 | Underbrink et al. | 375/308 |
| 6,998,910 B2 * | 2/2006 | Hezar et al. | 330/10 |
| 7,084,799 B1 | 8/2006 | Butler | |
| 7,209,067 B1 | 4/2007 | Melanson | |
| 7,576,604 B2 * | 8/2009 | Xu | 330/10 |
| 7,683,708 B2 * | 3/2010 | Koch | 330/10 |
| 7,800,437 B2 * | 9/2010 | Khoury et al. | 330/10 |
| 7,859,331 B2 * | 12/2010 | Beale et al. | 330/10 |

FOREIGN PATENT DOCUMENTS
GB 2 435 559 A 8/2007
* cited by examiner

*Primary Examiner* — Lam T Mai
(74) *Attorney, Agent, or Firm* — Schwegman, Lundberg & Woessner, P.A.

(57) ABSTRACT

The disclosure relates to an amplifier comprising a digital delta-sigma modulator, a quantifier receiving a signal supplied by a delta-sigma stage and supplying a quantified signal, and a power circuit supplying an output signal. The device comprises N state loops of a first type configured to send the output signal to adders of N delta-sigma stages of lower rank, each state loop of the first type comprising an analog low-pass filter for supplying a filtered output signal, and an analog to digital converter for supplying a digital filtered output signal.

20 Claims, 15 Drawing Sheets

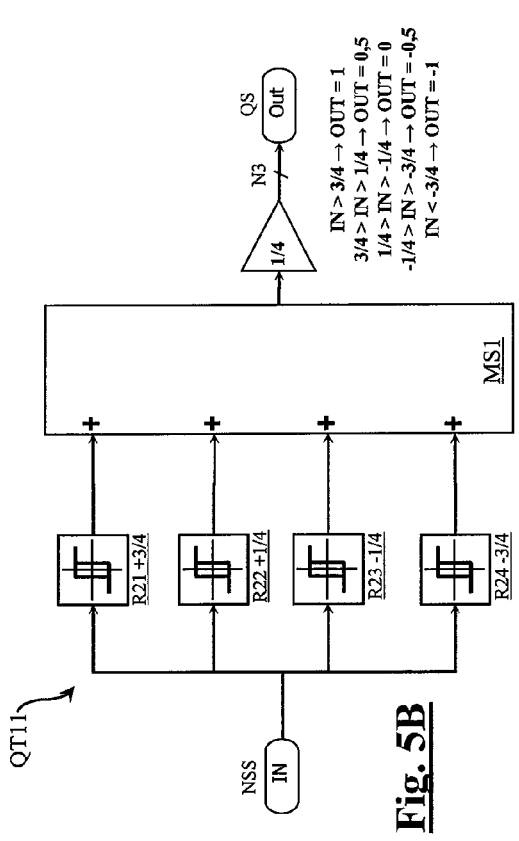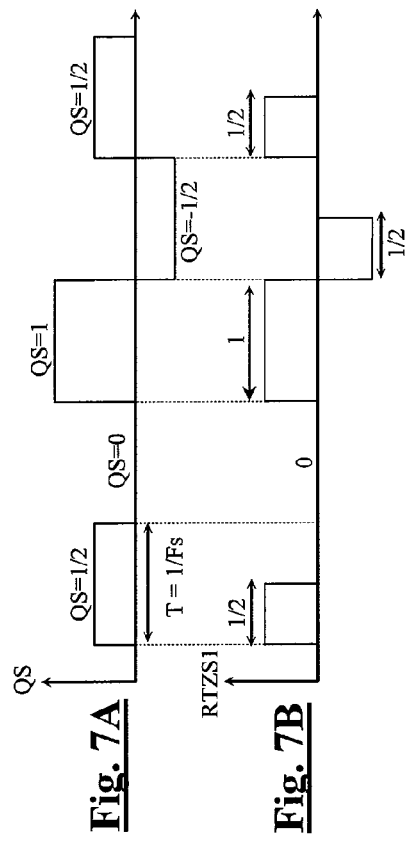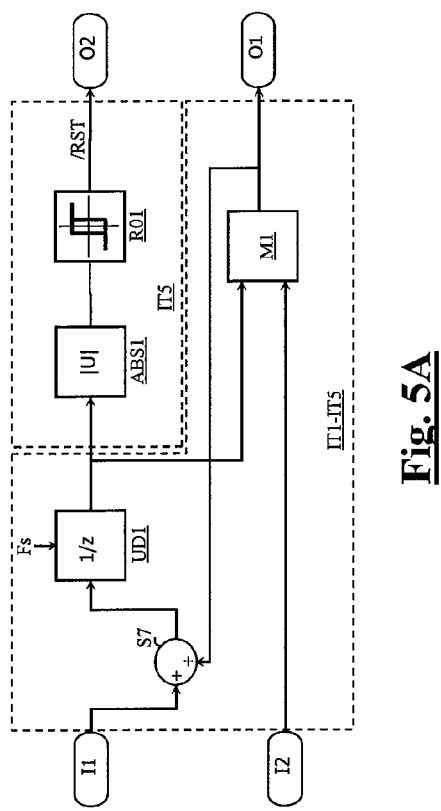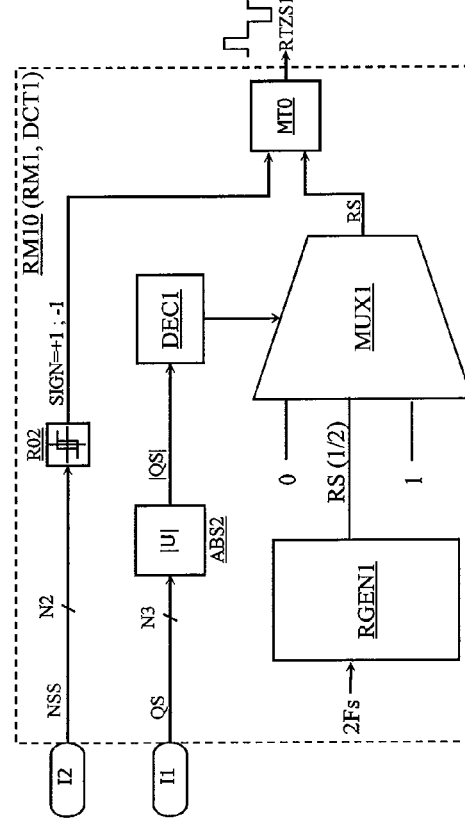

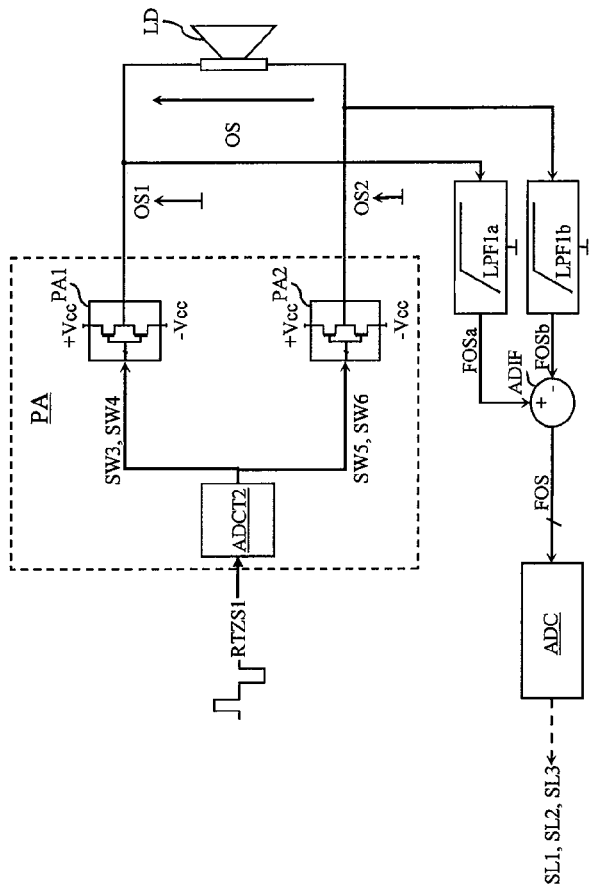
Fig. 8B
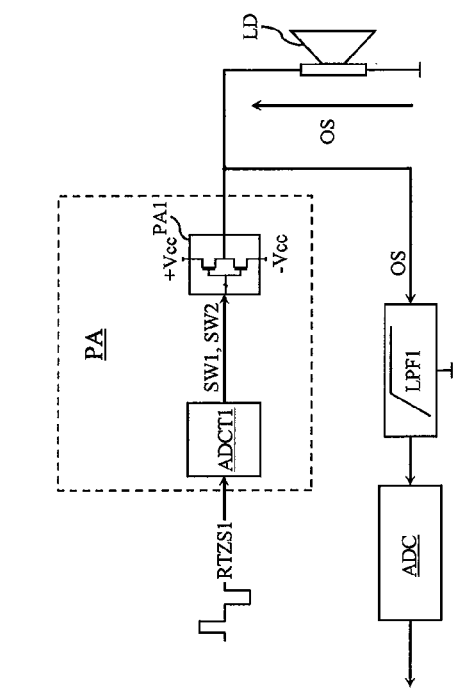
Fig. 8A
Fig. 9B
Fig. 9A

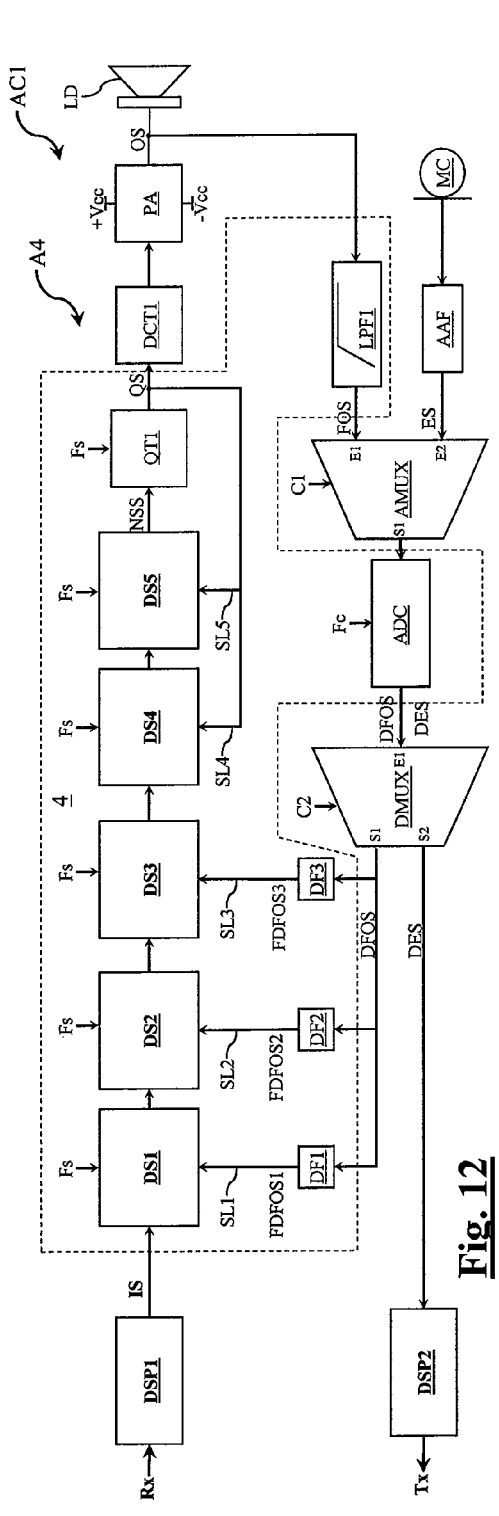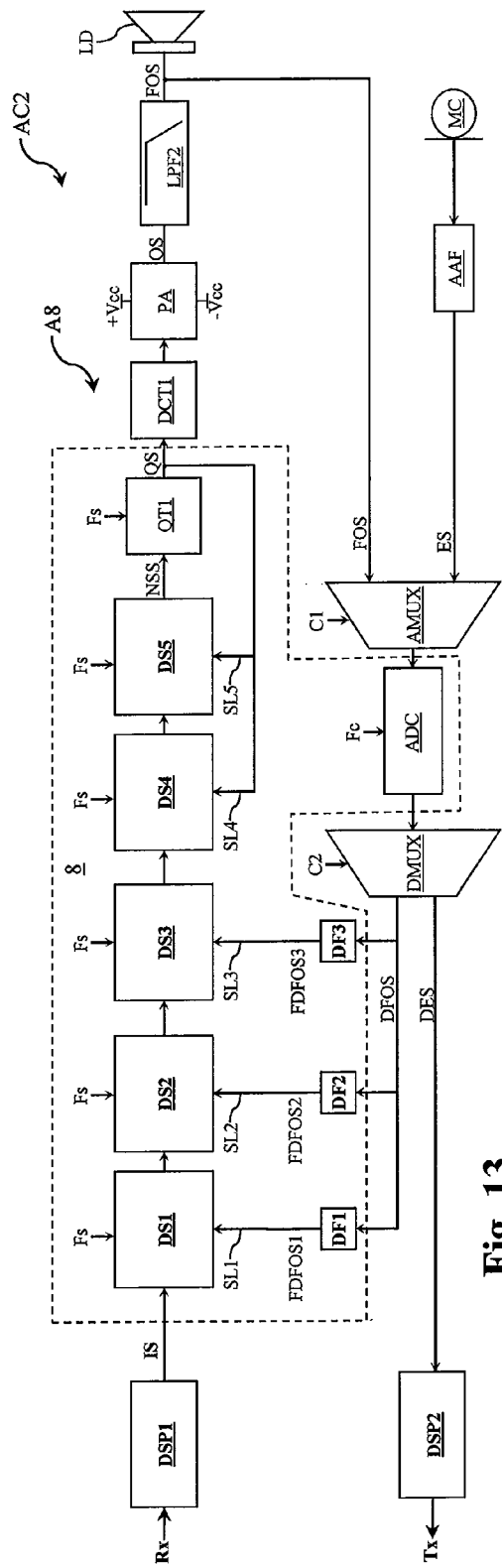
Fig. 12
Fig. 13

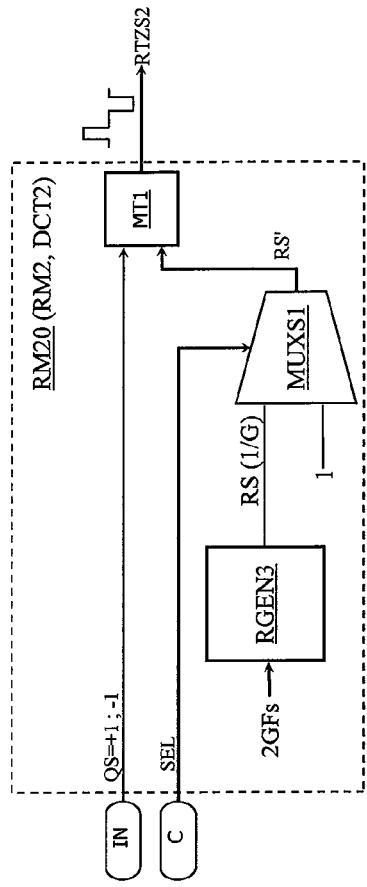
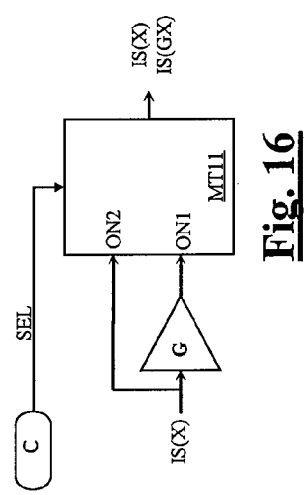
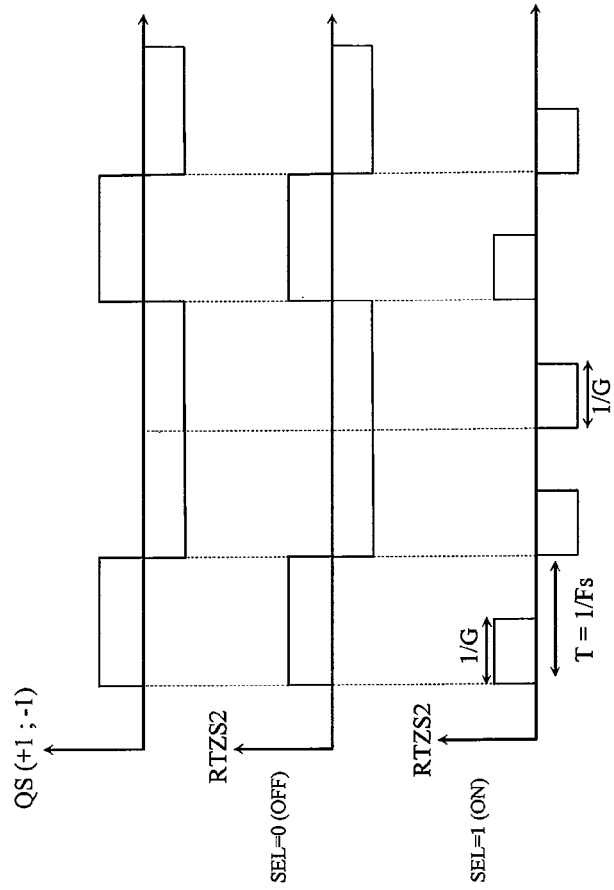
Fig. 17
Fig. 16
Fig. 18A
Fig. 18B
Fig. 18C

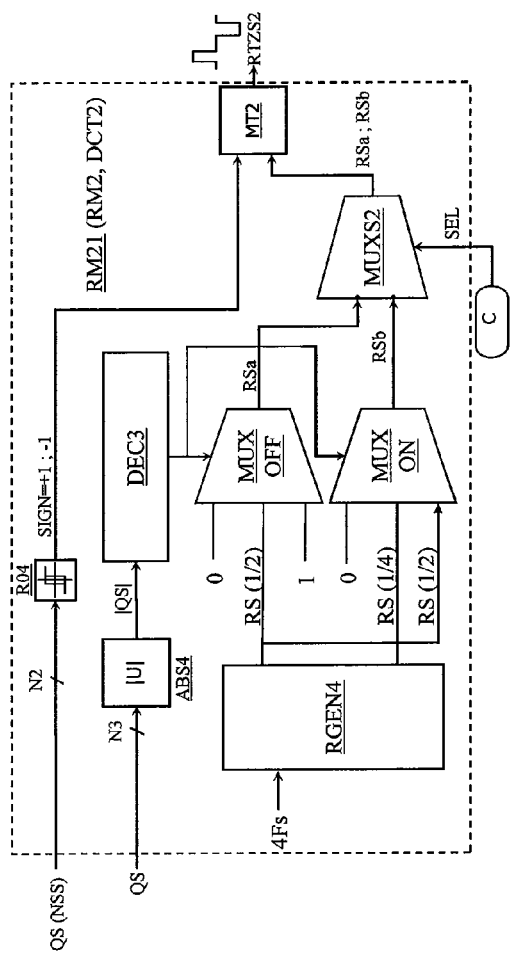
Fig. 19
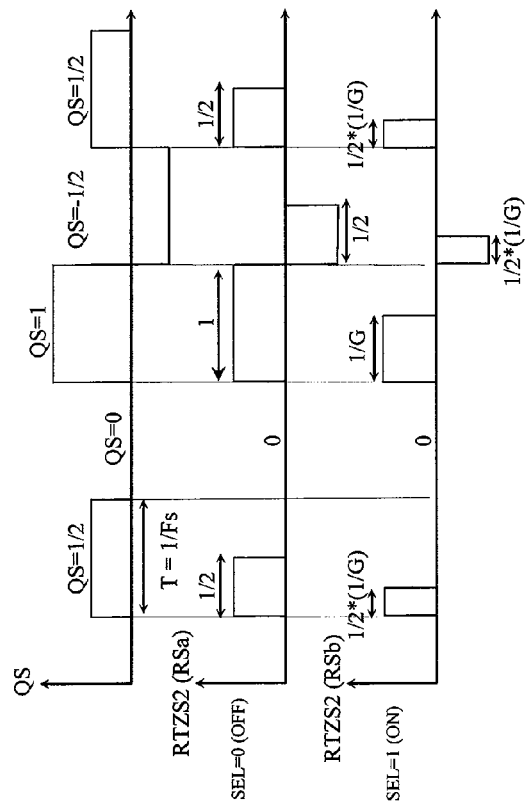
Fig. 20A
Fig. 20B
Fig. 20C

D-CLASS DIGITAL AMPLIFIER CONFIGURED FOR SHAPING NON-IDEALITIES OF AN OUTPUT SIGNAL

BACKGROUND

1. Technical Field

The present disclosure relates to an amplifier device comprising a digital modulator and a power circuit.

The present disclosure relates in particular to amplifiers comprising a digital delta-sigma modulator and a power circuit in class D.

2. Description of the Related Art

These last years, D-class amplification has known a significant development due to the need of making compact power amplifiers offering an energy efficiency very much higher than the efficiency offered by conventional AB-class amplifiers, which usually do not exceed 30%. Thus, a D-class amplifier easily offers 90% efficiency and thus only wastes 10% of the energy it consumes, vs. 70% of wasted energy in an AB-class amplifier. This is due to the fact that D-class amplifiers are chopper amplifiers, operating by MOS transistors switching and therefore consuming energy only during the switching periods.

FIG. 1A shows a conventional architecture of D-class amplifier. The amplifier comprises a modulator 1 which input receives a signal to be amplified IS and which output controls a power circuit PA in D-class. The output of the power circuit PA supplies an output signal OS to a load LD, for example a speaker.

The power circuit PA in D-class usually comprises MOSFET transistors arranged according to the "totem pole" mounting. It is a chopper circuit which supplies a square signal OS having the shape of a voltage square wave oscillating between two voltages +Vcc and −Vcc. In audio applications, the conversion of the output signal OS into analog audio signal is performed either by means of a low-pass filter LPF of LC type arranged between the output of the power circuit PA and the load LD, or by letting the load filter the output signal (mounting called "filterless").

Numerous D-class amplifiers are equipped with a pulse width modulator of PWM type. Others comprise a delta-sigma modulator supplying a pulse density modulated signal or PDM. A delta-sigma modulator has the advantage of performing a noise shaping which consists in rejecting the quantification noise in the field of high frequencies, outside the useful band, thanks to a feedback of the output on the input of the modulator and providing a high sampling frequency in relation to the bandwidth of the input signal.

In compensation for their advantageous efficiency, D-class amplifiers usually offer performances which are very much lower than those of AB-class amplifiers. An AB-class amplifier may easily have a total harmonic distortion THD of around 90 dB and a signal to noise ratio SNR of 100 dB whereas a D-class amplifier hardly reaches a THD of 40 dB and a SNR of 80 dB. Despite the noise shaping performed by the delta-sigma modulator, the defects inherent to the power circuit are not suppressed because they are generated downstream from the modulator, and cause a significant increase of the distortion and noise rates in the output signal.

The U.S. Pat. No. 5,777,512 of the company Tripath Technology discloses a D-class amplifier comprising a continuous-time delta-sigma modulator operating at high frequency (1.5 MHz). The output signal supplied by the power circuit is sent in a state loop of the delta-sigma modulator through an anti-aliasing filter and a continuous-time gain circuit.

Continuous-time or discrete time delta-sigma modulators (switch capacitance modulators, technique called "switch cap") raise stability issues with architectures of order higher than 2. Now, it may be hardly be hoped to obtain audio performances comparable to those of AB-class amplifiers with a 1 or 2 order delta-sigma modulator, unless making a modulator of high complexity and expensive to implement.

The present disclosure relates to amplifiers comprising a digital delta-sigma modulator. FIG. 1B shows a conventional architecture of digital delta-sigma modulator 1. The modulator 1 is here of 3 order and comprises three delta-sigma stages DSa, DSb, DSc and a quantifier QT. Each delta-sigma stage comprises an input adder Sa, Sb, Sc which output drives an integrator ITa, ITb, ITc. The positive input of the adder Sa of the delta-sigma stage DSa receives the input signal IS, the positive input of the adder Sb of the delta-sigma stage DSb receives the output of the integrator ITa and the positive input Sc of the delta-sigma stage DSc receives the output of the integrator ITb. The integrator ITc supplies to the quantifier a signal NSS and the quantifier QT supplies a quantified signal QS. The signal QS is sent to the negative input of the adder Sa through a state loop SLa, to the negative input of the adder Sb through a state loop SLb, and to the negative input of the adder Sc through a state loop SLc. The quantification noise is conventionally shaped by applying to the integrators ITa, ITb, ITc a clock signal having a frequency Fs much higher than the bandwidth of the input signal IS, generally higher than one Megahertz for an audio signal in the range 30 Hz–20 KHz. The quantified signal QS is applied to the power circuit PA. The latter supplies the output signal OS oscillating between +Vcc and −Vcc which is applied to the load LD, possibly through a low-pass filter LPF.

A major issue in the manufacture of a digital amplifier is to correct the defects introduced into the output signal OS by the power circuit PA. Such defects are called "non-idealities" and generate distortion and noise.

Various solutions have been suggested to that end. The technique usually retained consists in sending an error signal in the delta-sigma modulator. This error signal is for example elaborated by calculating a difference between an ideal square wave and the square wave supplied by the power circuit PA.

In particular, the U.S. Pat. No. 6,373,334 describes in relation with the FIGS. 2A, 9 thereof a digital delta-sigma modulator which delta-sigma stages receive two types of feedback signals, i.e. a signal taken from the output of the quantifier ("a priori feedback") and an error signal ("real time feedback") which is previously converted into digital signal by an analog to digital converter. The error signal is generated by comparing the signals supplied by the power circuit when it is connected to a load, to "ideal" signals supplied by reference switches which simulate the ideal operation of the power circuit in the absence of load.

It may be wished to provide an alternate technique allowing a digital amplifier to be conferred satisfying performances in terms of distortion, signal to noise ratio and efficiency.

The present disclosure also relates to audio codecs (compression-decompression circuits). Audio codecs generally comprise, on the same semiconductor chip, one or more amplifiers, analog to digital converters to convert external analog signals into digital signals, and signal process processors or DSP to convert into amplifiable audio signals digital audio data received or read in compressed or coded form and vice-versa. It may be wished to improve the structure of these codecs so as to decrease the complexity and cost thereof.

The present disclosure more generally relates to the noise reduction in digital modulators. It is known that digital modulators generate a quantification or sampling noise which is constant and independent of the signal, and which depends of the quantification or sampling step and the quantification or sampling frequency. Although this noise is in the order of the least significant bit of the modulated signal, its impact on the signal to noise ratio is all the more significant as the signal is low. It may thus be wished to provide a technique allowing the influence of the noise on low-amplitude signals to be reduced.

BRIEF SUMMARY

An embodiment of the present disclosure relates to an amplifier device receiving a digital input signal, and comprising: a digital delta-sigma modulator comprising M delta-sigma stages each comprising a state loop, where M is at least equal to 3, a quantifier receiving a signal supplied by a delta-sigma stage and supplying a quantified signal, and state loops to send state signals to adders of the delta-sigma stages; a power circuit to supply to an electric load an output signal which is function of the quantified signal; N state loops of a first type configured to send the output signal to the adders of N delta-sigma stages of lower rank, where N is at least equal to 1, each state loop of the first type comprising: an analog low-pass filter for filtering the output signal and supplying a filtered output signal, and an analog to digital converter for converting the filtered output signal into digital filtered output signal, and supplying to the adders of the N delta-sigma stages of lower rank a digital filtered output signal including non-idealities of the output signal.

According to one embodiment, the analog low-pass filter and the analog to digital converter are common to all the state loops of the first type.

According to one embodiment, the amplifier device also comprises, between the analog to digital converter and the N delta-sigma stages of lower rank, at least one digital filter for filtering the digital filtered output signal and supplying to the adders of the N delta-sigma stages of lower rank a filtered digital filtered output signal including non-idealities of the output signal.

According to one embodiment, the amplifier device comprises a digital filter common to all the state loops of the first type.

According to one embodiment, each state loop of the first type comprises a dedicated digital filter.

According to one embodiment, the digital filter is a low-pass filter having a cut-off frequency at −3 dB at least twice higher than the cut-off frequency at −3 dB of the analog low-pass filter.

According to one embodiment, the digital filter is a high-pass filter.

According to one embodiment, the digital filter comprises a combination of a low-pass filter and a high-pass filter.

According to one embodiment, the amplifier device also comprises M-N state loops of a second type configured to send the quantified signal to the adders of M-N delta-sigma stages of higher rank.

According to one embodiment, the amplifier comprises comprising nonlinear stabilization elements arranged in all or part of the delta-sigma stages and configured to prevent saturation in amplitude of the delta-sigma modulator.

According to one embodiment, the analog low-pass filter has a cut-off frequency at −3 dB around 5 to 10 times the cut-off frequency at −3 dB of the input signal.

According to one embodiment, the power circuit is linked or intended to be linked to the load without interposing an analog low-pass filter, and the analog low-pass filter of the state loops of the first type is arranged between the load and the analog to digital converter.

According to one embodiment, the analog low-pass filter has electrical features which simulate the impedance of the load seen from the power circuit.

According to one embodiment, the analog low-pass filter is arranged between the power circuit and the load.

According to one embodiment, the delta-sigma modulator receives the input signal coded on N1 bits and operates on N2 bits, where N2 is greater than N1.

According to one embodiment, the amplifier device comprises a RTZ converter receiving the quantified signal and supplying to the power circuit a control signal coded RTZ which duty cycle is a function of the amplitude of the quantified signal.

According to one embodiment, the power circuit is a D-class amplifier with a balanced or unbalanced configuration.

According to one embodiment, the amplifier device comprises means for, when the amplitude of the input signal is lower than a threshold, applying a gain to the signal supplied to the quantifier so as to increase the ratio between this signal and a quantification noise, and applying an inverse gain upstream from the quantifier, so that the global gain of the amplifier device is unchanged.

An embodiment of the disclosure also relates to a semiconductor chip, comprising an amplifier device according to one of claims 1 to 18, embedded in the chip.

An embodiment of the disclosure also relates to an audio codec comprising: an amplifier device as described above, comprising an analog to digital converter; a first selection circuit having a first input configured to receive the filtered output signal; at least one second input configured to receive an external signal, and one output linked to the input of the analog to digital converter of the amplifier device, the output of the first selection circuit being connected to the first or second input of the first selection circuit as a function of a control signal applied to the first selection circuit; and a second selection circuit having an input linked to the output of the analog to digital converter, a first output linked to the amplifier device, and at least one second output, the first or the second output of the second selection circuit being connected to the input of the second selection circuit as a function of a control signal applied to the second selection circuit.

BRIEF DESCRIPTION OF THE SEVERAL VIEWS OF THE DRAWINGS

Embodiments of digital amplifiers implementing improvements according to the present disclosure will be described hereinafter, in relation with, but not limited to the appended figures wherein:

FIG. 6 shows an embodiment of a converter RTZ shown in block form in FIG. 4, FIGS. 7A, 7B are chronograms showing the operation of the converter of FIG. 6, FIGS. 8A, 8B show two embodiments of a power circuit shown in block form in FIG. 4, FIGS. 9A, 9B are tables showing the conversion of control signals RTZ into output signals supplied by the power circuits shown in FIGS. 8A, 8B, FIGS. 12 and 13 show example embodiments of audio codecs according to the second improvement of the disclosure, FIG. 16 shows an embodiment of a gain unit shown in block form in FIG. 15, FIG. 17 shows a first embodiment of a variable gain converter RTZ shown in block form in FIG. 15, FIGS. 18A to 18C are chronograms showing the operation of the converter of FIG. 17, FIG. 19 shows another embodiment of a variable gain converter RTZ shown in block form in FIG. 15, FIGS. 20A to 20C are chronograms showing the operation of the converter of FIG. 19.

DETAILED DESCRIPTION

Figure 1A:
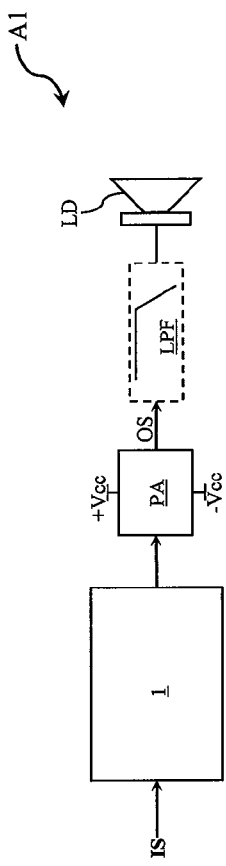
FIGS. 1A, 1B previously described show the conventional architecture of a digital amplifier.

The present disclosure provides three improvements applicable to amplifiers comprising a digital modulator of delta-sigma type, the third improvement being more generally applicable to amplifiers comprising a digital modulator of any type, as long as the modulator behaves like a source of constant noise. As it will appear hereinafter, each improvement is in itself independent of the others and the improvements may thus be implemented independently or combined.

First Improvement

FIGS. 2A, 2B, 2C, 2D show embodiments of amplifiers according to the first improvement, respectively referred to as A2, A3, A4, A5. Each amplifier comprises a delta-sigma modulator 2 (FIG. 2A), 3 (FIG. 2B), 4 (FIG. 2C), 5 (FIG. 2D) and a power circuit PA linked to a load LD, for example a speaker. In one embodiment, the power circuit PA is a D-class amplifier circuit.

As indicated in the Background section, conventional continuous-time or switch capacitance delta-sigma modulators raise setting difficulties for orders higher than 2, due to stability issues which appear from the order 3, so that high performances in terms of THD (Total Harmonic Distortion) or SNR (Signal to Noise Ratio) can hardly be reached, or at the cost of a prohibitive complexity.

All the amplifiers according to the first improvement A2, A3, A4, A5 comprise a totally digital delta-sigma modulator 2, 3, 4, 5 of order superior or equal to 3 and generally of order "M", where M is at least equal to 3. In the embodiments shown, each delta-sigma modulator 2, 3, 4, 5 is of order 5 and comprises 5 delta-sigma stages DS1, DS2, DS3, DS4, DS5, five state loops SL1, SL2, SL3, SL4, SL5 as well as a quantifier QT1. The delta-sigma stage of lower rank DS1 receives the input signal IS of the amplifier and the delta-sigma stage of higher rank DS5 supplies to the quantifier QT1 a signal NSS. The quantifier QT1 supplies a quantified signal QS to the power circuit PA. Each delta-sigma modulator 2 to 5 is clocked by an oversampling clock signal of frequency Fs very much higher than the bandwidth of the signal IS, for example 4 MHz. The signal IS is a digital signal, for example an audio signal of bandwidth 30 Hz-20 kHz supplied by a digital audio processor of DSP type (not shown) and coming from a source of musical signal such as a CD, a radio station, a MP3 file . . . . A driver circuit DCT1, described hereinafter, may be provided between the quantifier QT1 and the power circuit PA.

Each delta-sigma stage DS1, DS2, DS3, DS4, DS5 comprises, in a conventional way in itself, an adder, respectively S1, S2, S3, S4, S5, which output is applied to an integrator, respectively IT1, IT2, IT3, IT4, IT5. Each adder comprises at least one positive input and one negative input. Each positive and negative input of an adder may have a gain, shown in FIG. 2A by gain units placed on the positive and negative inputs of the adders. Thus, the positive input of the adder S1 of the delta-sigma stage DS1 has a gain g11 and its negative input has a gain g12, the positive input of the adder S2 of the delta-sigma stage DS2 has a gain g21 and its negative input has a gain g22, and so on up to the adder S5 which positive input has a gain g51 and the negative input a gain g52. These various gains may be integrated in the very structure of the adders or be formed by the gain units placed on the positive and negative inputs of the adders, as shown (to simplify figures, the structure of the delta-sigma stages DS1 to DS5 is shown only in FIG. 2A and is shown in block form in the other figures).

The adder S1 receives the signal IS on its positive input, its negative input is linked to the state loop SL1 and its output is applied to the integrator IT1. The adder S2 has its positive input linked to the output of the integrator IT1, its negative input linked to the state loop SL2 and its output applied to the integrator IT2. Likewise, the adder S3 has its positive input linked to the output of the integrator IT2, its negative input linked to the state loop SL3 and its output applied to the integrator IT3; the adder S4 has its positive input linked to the output of the integrator IT3, its negative input linked to the state loop SL4 and its output applied to the integrator IT4. Lastly, the adder S5 has its positive input linked to the output of the integrator IT4, its negative input linked to the state loop SL5 and its output supplies to the signal NSS applied to the quantifier QT1.

According to the first improvement of the disclosure, each delta-sigma modulator 2, 3, 4, 5 performs a shaping of the noise which integrates the non-idealities (distortion, noise, . . . ) generated by the power circuit PA. More particularly, the shaping of the non-idealities of the output signal OS is obtained thanks to the state loops of lower rank which send the output signal OS into delta-sigma stages of lower rank through an analog low-pass filter LPF1 and an analog to digital converter ADC. In the embodiments shown in FIGS. 2A, 2B, 2C, 2D, one or more digital filters are also provided between the analog to digital converter ADC and the delta-sigma stages of lower rank.

Figure 2A:
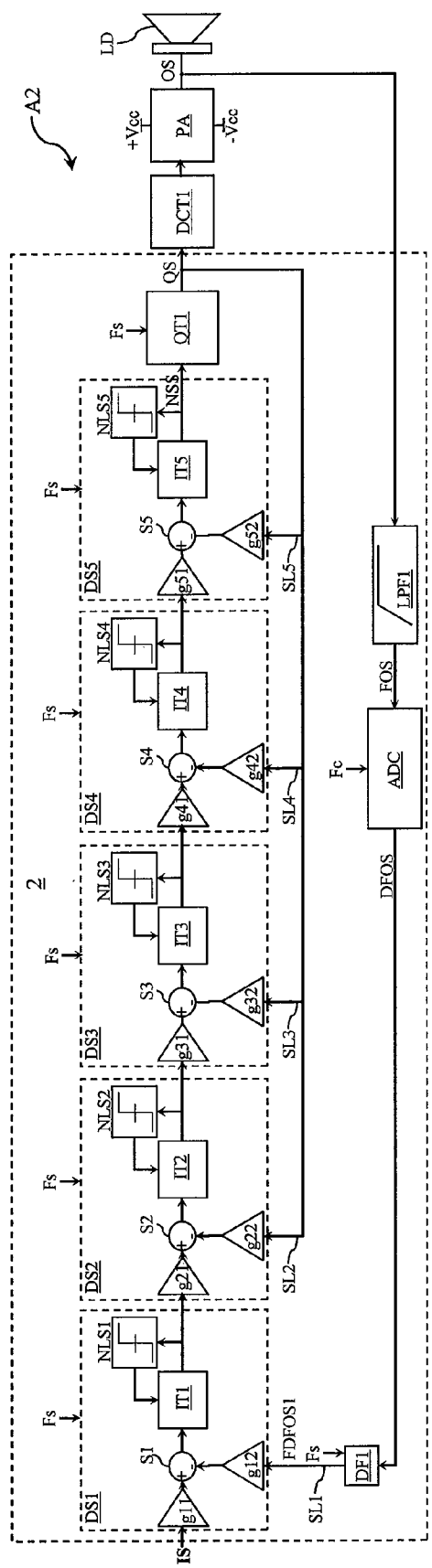
FIGS. 2A to 2D show embodiments of amplifiers according to the first improvement of the disclosure, of the type without output filter.

In the embodiment shown in FIG. 2A, the output signal OS is sent into the state loop of lower rank SL1 through the low-pass filter LPF1, the converter ADC and a digital low-pass filter DF1. The filter LPF1 supplies a filtered output signal FOS. The converter ADC supplies a digital filtered output signal DFOS. The digital filter DF1 supplies to the negative input of the adder S1 a filtered digital filtered output signal FDFOS1. The output signal OS is therefore filtered twice, on the one hand in the analog field and on the other hand in the digital field, before being applied to the negative input of the adder S1 and the delta-sigma modulator 2.

Figure 2B:
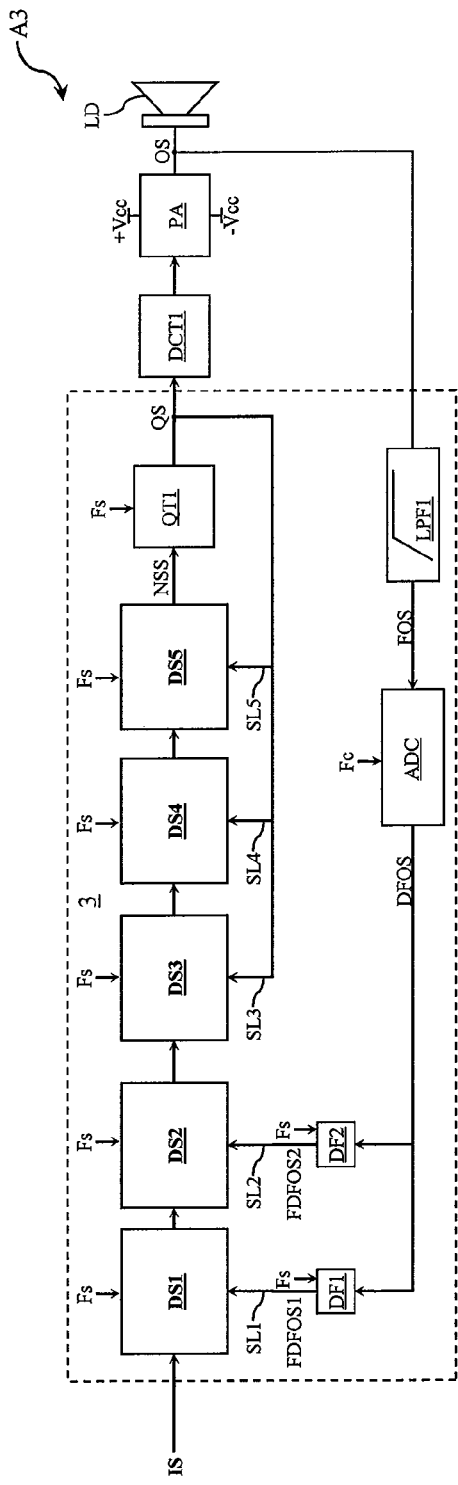

In the embodiment shown in FIG. 2B, the output signal OS is sent into the two state loops of lower rank SL1, SL2 through the filter LPF1, the converter ADC, the digital filter DF1 arranged in the state loop SL1 and a digital low-pass filter DF2 arranged in the state loop SL2. Thus, the filter LPF1 supplies the filtered output signal FOS, the converter ADC supplies the digital filtered output signal DFOS, the digital filter DF1 supplies to the negative input of the adder S1 the filtered digital filtered output signal FDFOS1 and the digital filter DF2 supplies to the negative input of the adder S2 a filtered digital filtered output signal FDFOS2.

Figure 2C:
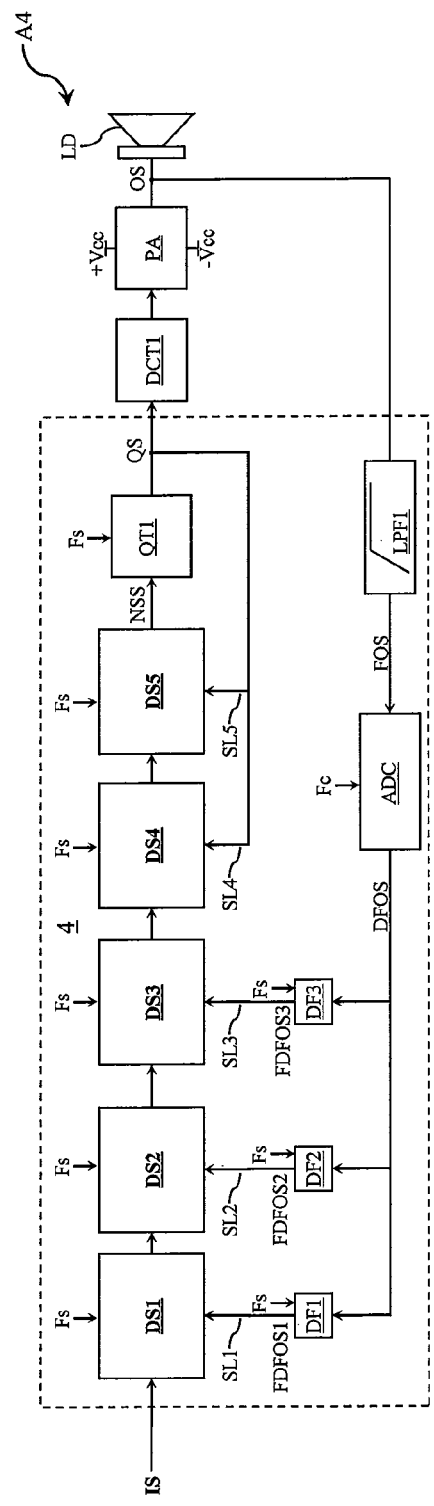

In the embodiment shown in FIG. 2C, the output signal OS is sent into the three state loops of lower rank SL1, SL2, SL3 through the filter LPF1, the converter ADC, the digital filter DF1 arranged in the state loop SL1, the digital filter DF2 arranged in the state loop SL2 and a digital low-pass filter DF3 arranged in the state loop SL3. Thus, the filter LPF1 supplies the filtered output signal FOS, the converter ADC supplies the digital filtered output signal DFOS, the digital filter DF1 supplies to the negative input of the adder S1 the filtered digital filtered output signal FDFOS1, the digital filter DF2 supplies to the negative input of the adder S2 a filtered digital filtered output signal FDFOS2 and the digital filter DF3 supplies to the negative input of the adder S3 a filtered digital filtered output signal FDFOS3.

Figure 2D:
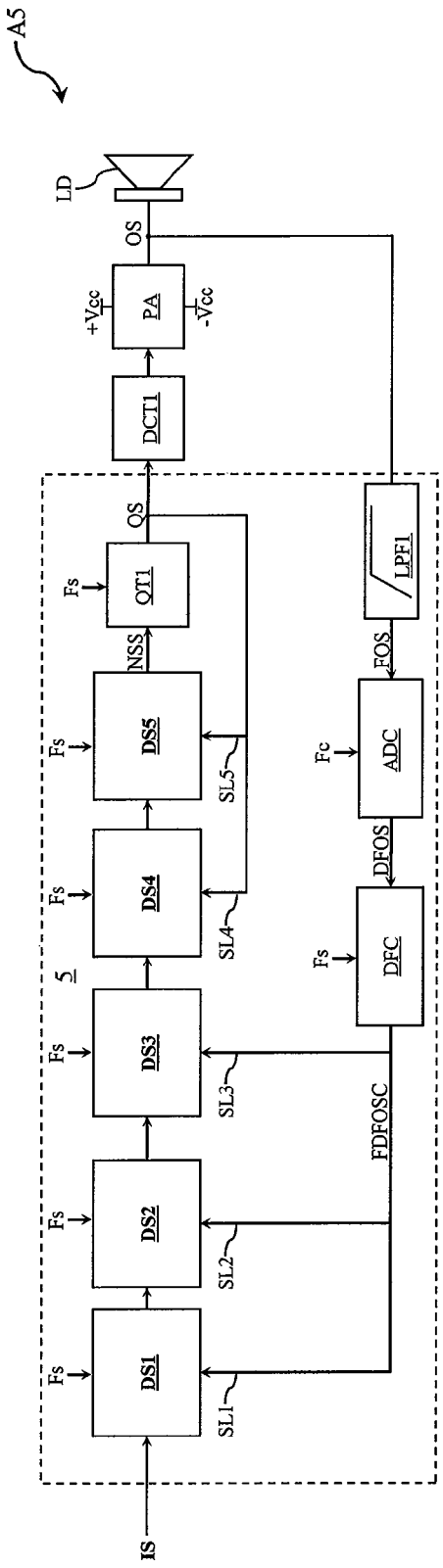

In the embodiment shown in FIG. 2D, the output signal OS is sent into the three state loops of lower rank SL1, SL2, SL3 through the filter LPF1, the converter ADC, and a digital low-pass filter DFC common to the three state loops SL1, SL2, SL3. Thus, the filter LPF1 supplies the filtered output signal FOS, the converter ADC supplies the digital filtered output signal DFOS, the common digital filter DFC supplies to the negative inputs of the adders S1, S2, S3 a common filtered digital filtered output signal FDFOSC.

According to the disclosure, this filter LPF1 is designed to simulate the impedance of the load LD between its input and its output, i.e. an impedance of electroacoustic transducer in the case of a load LD of the type speaker. Thus, the analog electrical signal FOS supplied by the filter LPF1 to the converter ADC is the image of the signal which animates the diaphragm of the speaker and is therefore the image of the acoustic signal that the user hears. It thus contains all the audible imperfections which are wished to be corrected. The filter LPF1 is preferably a filter RC which may be integrated with the rest of the amplifier on a semiconductor chip, the use of a filter LC being little wishable in this embodiment because it would require the provision of a self-inductance which integration on a semiconductor substrate would be prohibitive due to its dimensions.

In brief, the integration of the non-idealities into the process of noise shaping is made in a way which differs from known techniques, by means of a feedback of the output signal OS in its entirety into the state loops of delta-sigma stages of lower order SL1 (FIG. 2A), SL1 and SL2 (FIG. 2B) or SL1, SL2 and SL3 (FIGS. 2C and 2D), through the low-pass filter LPF1, which simulates the impedance of the load LD and cannot be compared to a conventional anti-aliasing filter, of the converter ADC and digital filters.

The other state loops, of higher rank, respectively SL2 to SL5 (FIG. 2A), SL3 to SL5 (FIG. 2B) or SL4 and SL5 (FIGS. 2C and 2D) receive the quantified signal QS, the latter being applied to the negative inputs of the corresponding adders S2 to S5 (FIG. 2A), S3 to S5 (FIG. 2B) or S4 and S5 (FIGS. 2C and 2D).

In one embodiment, the filter LPF1 preferably has a cut-off frequency at −3 dB in the order of 5 to 10 times the cut-off frequency at −3 dB of the input signal (IS), i.e. a cut-off frequency in the order of 100 to 200 kHz if the input signal IS has a cut-off frequency at −3 dB in the order of 20 kHz. Tests made with a filter LPF1 having a cut-off frequency in the order of 100 kHz for example have given excellent results in terms of Total Harmonic Distortion THD and Signal to Noise Ratio SNR.

In one embodiment, the converter ADC is a rapid converter clocked by a sampling frequency Fc superior or equal to twice the sampling frequency Fs of the delta-sigma modulator. The converter ADC may for example be a rapid converter of MASH type ("Multi-Stage noise Shaping") or equivalent.

In other embodiments, the converter ADC may be a switch capacitance converter or a continuous time converter. It is to be noted that in the case where the converter ADC is a continuous time converter, the action of low-pass filter LPF1 may be performed by the converter itself. In other words, the converter ADC and the filter LPF1 form in this case a single element.

In one embodiment, the filters DF1, DF2, DF3 or DFC may be filters IIR Chebyschev of Type II ("Infinite Impulse Response").

In addition to the action of the low-pass filter LPF1, the digital filters DF1, DF2, DF3, DFC have an additional action on the stability of the delta-sigma modulator and the fact of obtaining an amplifier which has high performances in terms of THD and SNR. This additional action is wishable in some embodiments, when the converter ADC operates at a higher frequency than the sampling frequency Fs of the delta-sigma modulator, for example when the sampling frequency Fc is superior or equal to twice the sampling frequency Fs.

As digital example, the following not limiting examples are supplied:

EXAMPLE 1

Configuration with Digital Filter(s)

i) The low-pass filter LPF1 is an analog filter of the first order with a cut-off frequency at −3 dB of 200 kHz;
ii) The converter ADC is a converter of PDM type (Pulse Density Modulation), for example of commercial reference AD7720, having 1 bit of output and comprising a delta-sigma converter of order 5, 6 or 7, clocked at a frequency Fc of 12 MHz so as to increase the signal to noise ratio SNR of the converter in the audio band, whereas the sampling frequency Fs of the delta-sigma modulator is of 6 MHz;
iii) The digital filter(s) are filters IIR Chebyschev of Type II and order 5, 6 or 7, comprising a bus of 28 bits, offering a quite wide band-pass frequency, for example 2 MHz, and a band-stop frequency at −80 dB which is preferably equal to or near half the operating frequency of the converter ADC, for example a frequency in the order of 3 to 4 MHz.

EXAMPLE 2

Configuration without Digital Filter(s)

i) The low-pass filter is identical to that of the example 1;
ii) The converter ADC is identical to that of the example 1 but is clocked at a frequency Fs of 3.125 MHz equal to the sampling frequency Fs of the delta-sigma modulator;
iii) No digital filter is provided because such a digital filter is not necessary due to the fact that Fs=Fc.

The digital filters DF1-DF3, DFC preferably used in the conditions mentioned above, perform, in addition to a function of softening the quantification noise of the analog to digital converter ADC, a function of correcting the nonlinearities of the output signal OS present in the signal DFOS, before the latter is applied to the delta-sigma modulator 2, 3, 4, 5. A too low or too high cut-off frequency leads to instability of the modulator. Thus, preferably, the digital filters have a cut-off frequency at −3 dB at least twice superior to the cut-off frequency at −3 dB of the filter LPF1. As a digital example, the digital filter of lower rank, i.e. the filter DF1 of the amplifiers A2, A3, A4 or the common filter DFC used in the amplifier A5, may have a cut-off frequency at −3 dB of 500 kHz. In addition, the filter DF2 may have a cut-off frequency at −3 dB of 500 kHz (FIG. 2B, 2C) and the filter DF3 may have a cut-off frequency at −3 dB of 1.5 MHz (FIG. 2C).

Some tests have for example shown that if the cut-off frequency of the filter DF1 is decreased from 1 MHz to 200 kHz, there is a linear decrease of the signal to noise ratio from 130 dB to 117 dB. The SNR therefore remains acceptable and the amplifier still operates. Below 200 kHz, the SNR abruptly drops at 26 dB and the amplifier does not operate any longer. There is therefore a lower cut-off frequency limit beyond which digital filters have no effect on the stability and performances of the delta-sigma modulator.

The digital filter of lower rank DF1 or DFC must in addition, preferably, have a band-stop frequency at 120 dB in the order of half the bandwidth of the delta-sigma modulator, i.e. in the order of Fs/2 or here 2 MHz. Generally, their reduction to the frequency Fs/2 must preferably be higher than the target signal/noise feature, for example be at least equal to 100 dB. Thus, for example, a decrease of 80 dB would not allow a SNR of 100 dB to be reached. The digital filters DF2 and DF3 acting on delta-sigma stages of order 2 and 3 are less critical for the stability and performances of the modulator and may have at the frequency Fs/2 a decrease in the order of 80 dB and 60 dB, respectively, instead of 120 dB (FIGS. 2B and 2C).

In one embodiment, the digital filters DF1-F3, DFC may also be high-pass filters, for example high-pass filters of first order provided to correct the pole introduced by the analog low-pass filter preceding the converter ADC. A combination of digital low-pass and high-pass filters may also be provided so as to bring a better stability to the state loop.

It will be clear to those skilled in the art that the implementation parameters and information which are described here are supplied only as non-limiting information. Those skilled in the art can adjust these parameters as a function of the components used in the target application, in the light of the present description.

The embodiments which have just been described relate to an amplifier called "filterless" which power circuit PA directly attacks the load LD. Embodiments of the disclosure also relate to amplifiers which power circuit PA drives the load through an output filter. In that case, it is not necessary to simulate the impedance of the load LD by means of the filter LPF1, since the filtered signal applied to the load is already an analog signal that the load is assumed to reproduce faithfully.

Figure 3A:
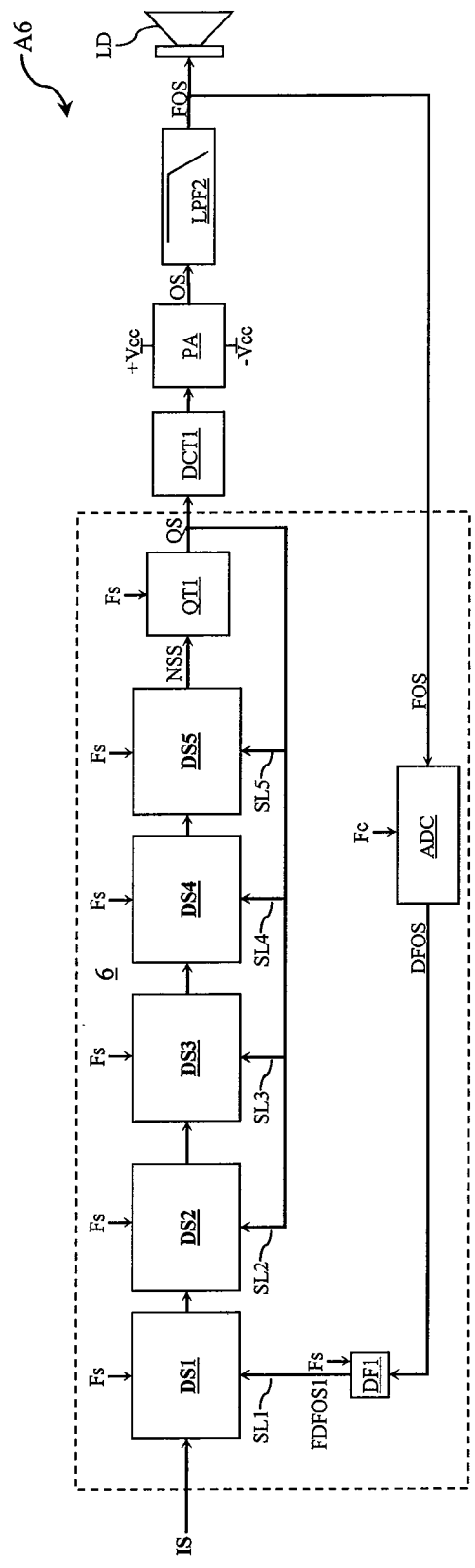
FIGS. 3A to 3C show embodiments of amplifiers according to the first improvement of the disclosure, of the type with output filter.
Figure 3B:
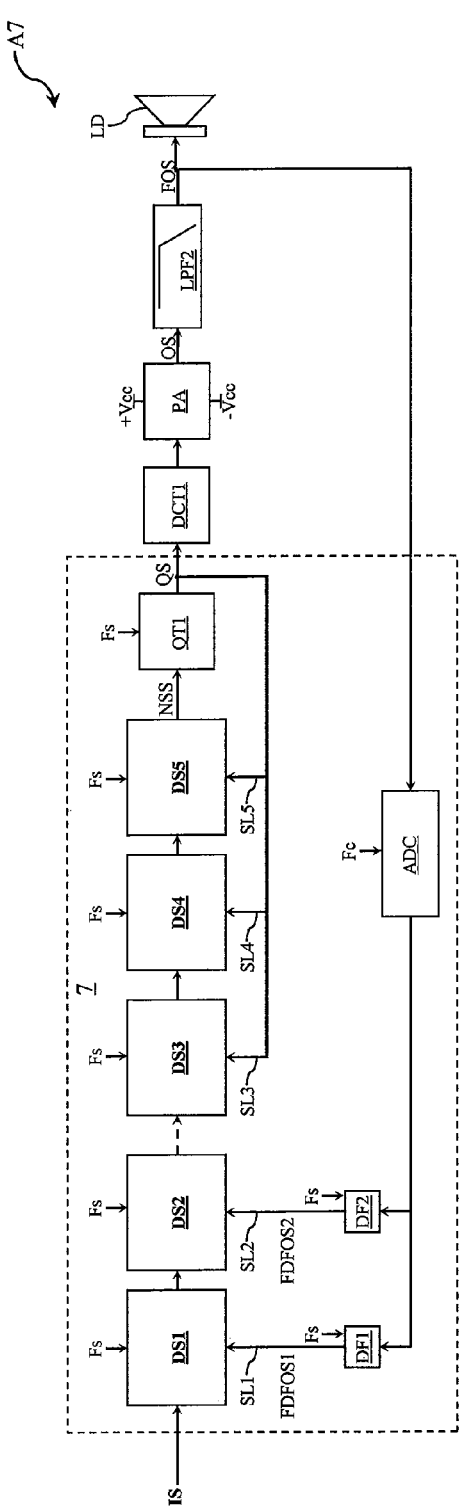
Figure 3C:
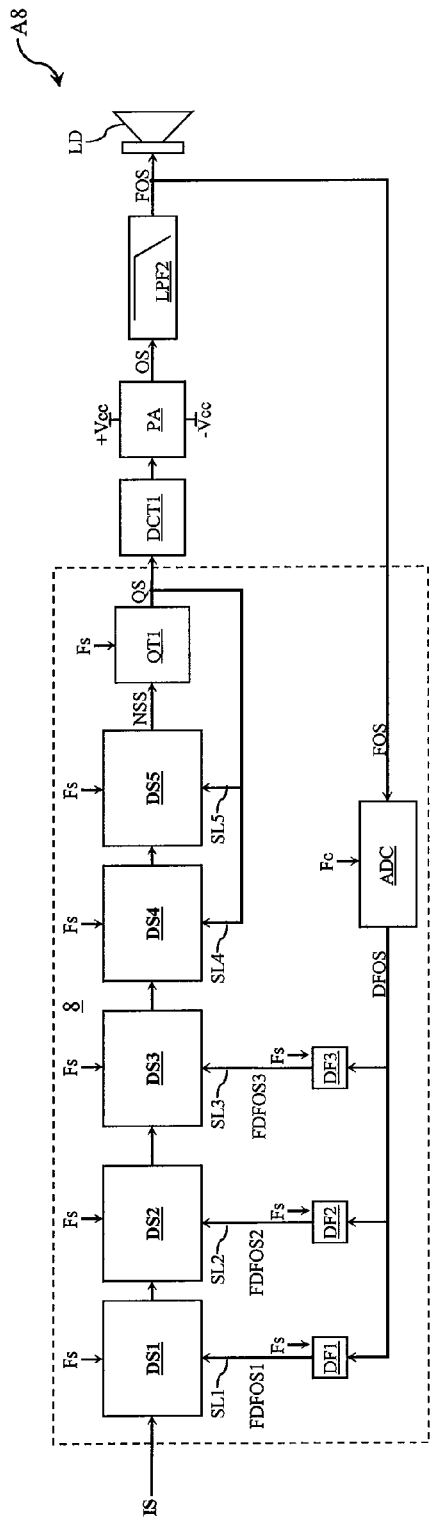

As an example, FIGS. 3A, 3B, 3C show embodiments of amplifiers A6, A7, A8 which are connected to the load LD through a low-pass filter LPF2. This filter is conventionally a filter LC comprising a voluminous coil which is external to the semiconductor wafer receiving the amplifier A6, A7 or A8. Admittedly, the various embodiments described here may also be made with discrete components mounted on an interconnection circuit (printed circuit, thin film circuit, etc.).

The amplifier A6 shown in FIG. 3A has the same structure as the amplifier A2 shown in FIG. 2A and therefore will not be described in details. It differs from the amplifier A2 only in that the state loop SL1 comprises only the converter ADC and the digital filter DF1, the low-pass filter LPF1 being suppressed. The analog signal FOS is directly taken from the output of the filter LPF2, i.e. at the terminals of the load LD, to be applied to the converter ADC.

The amplifier A7 shown in FIG. 3B has the same structure as the amplifier A3 shown in FIG. 2B. It differs from the amplifier A3 only in that the state loops SL1, SL2 comprise only the converter ADC and the digital filter DF1, DF2, the low-pass filter LPF1 being suppressed. The analog signal FOS is as previously taken from the output of the filter LPF2, at the terminals of the load LD, to be applied to the converter ADC.

Likewise, the amplifier A8 shown in FIG. 3C has the same structure as the amplifier A4 shown in FIG. 2C. It differs from the amplifier A4 only in that the state loops SL1, SL2, SL3 comprise only the converter ADC and the digital filter DF1, DF2, DF3, and therefore do not comprise the low-pass filter LPF1. The analog signal FOS is as previously taken from the output of the filter LPF2.

According to an advantageous but optional aspect of the first improvement, the delta-sigma modulator used to make any amplifier A2 to A8 previously described comprises nonlinear stabilization means, so as to avoid the amplitude of the digital signal processed by the modulator from reaching a saturation threshold. These nonlinear stabilization elements are arranged in all or part of the delta-sigma stages and are configured to prevent saturation in amplitude of the modulator. In FIG. 2A, each delta-sigma stage DS1, DS2, DS3, DS4, DS5 comprises a nonlinear stabilization means respectively NLS1, NLS2, NLS3, NLS4, NLS5. Such stabilization means are known in themselves and described in literature. They are generally implemented in digital to analog converters or analog to digital converters based on delta-sigma modulators. A delta-sigma modulator behaves like a nonlinear system which is hard to precisely model by equations from the order 3. The stabilization of the modulator can only be achieved by means of stabilization techniques having an experimental nature and by using simulation software. The application of these techniques to an amplifier of the type which has just been described advantageously makes it possible to make an amplifier having a delta-sigma modulator of high order while resolving the modulator stability issues.

Figure 4:
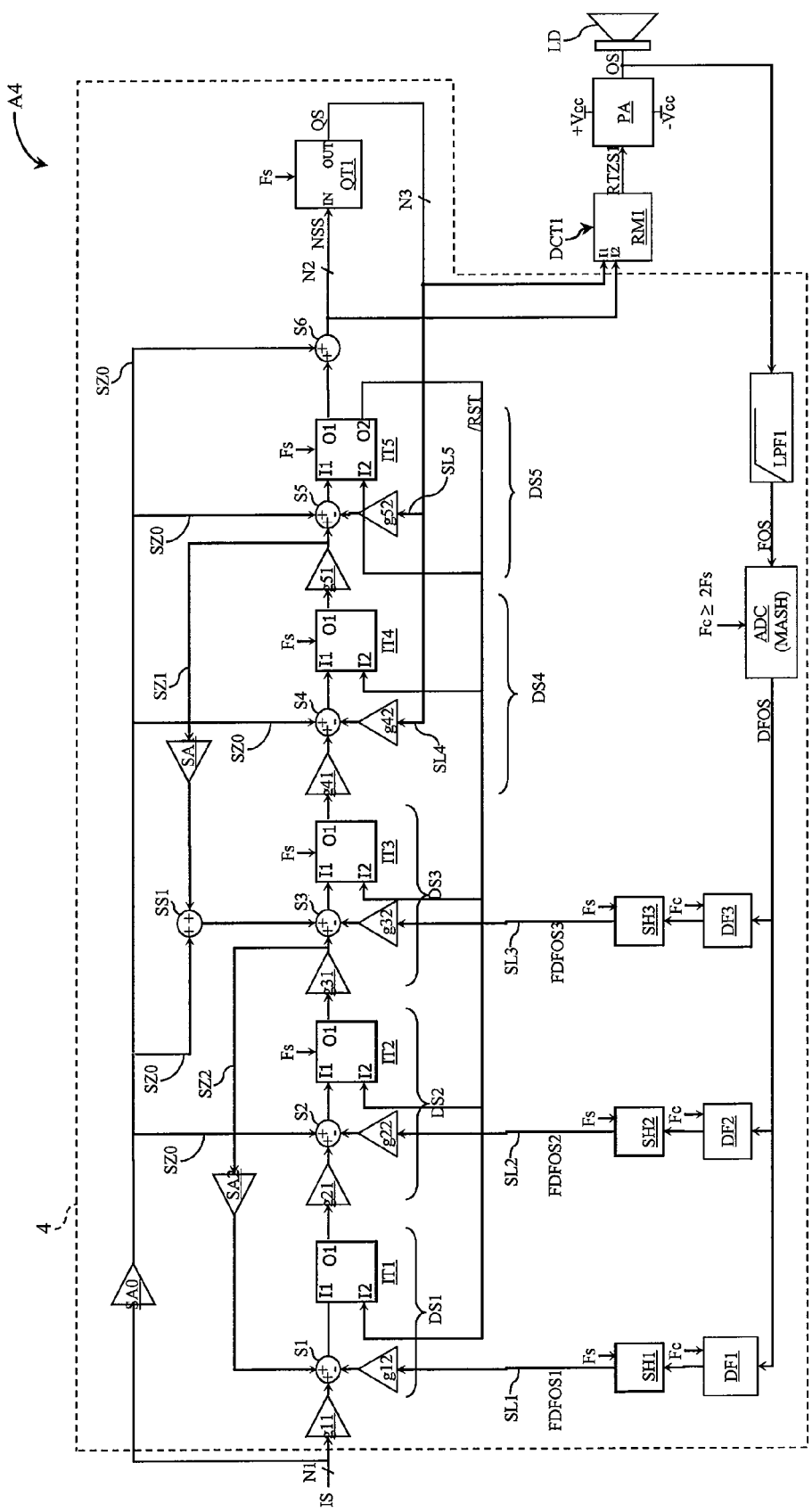
FIG. 4 shows in more details an embodiment of the amplifier shown in FIG. 2C, FIGS. 5A and 5B show embodiments of an integrator and a quantifier shown in block form in FIG. 4.

FIG. 4 shows in more details an embodiment of the amplifier A4 shown in FIG. 2C. Each integrator IT1 to IT5 comprises inputs I1, I2 and an output O1. The positive input of the adder S1 receives the input signal IS through the gain unit g11. The output of the adder S1 is applied to the input I1 of the integrator IT1 which output O1 is linked to the positive input of the adder S2 through the gain unit g21. The output of the adder S2 is applied to the input I1 of the integrator IT2 which output O1 is linked to the positive input of the adder S3 through the gain unit g31. Likewise, the output of the adder S3 is applied to the input I1 of the integrator IT3 which output O1 is linked to the positive input of the adder S4 through the gain unit g41. The output of the adder S4 is applied to the input I1 of the integrator IT4 which output O1 is linked to the positive input of the adder S5 through the gain unit g51. Eventually, the output of the adder S5 is applied to the input I1 of the integrator IT5 which output O1 is linked to the positive input of the adder S6 which output supplies the signal NSS applied to the quantifier QT1.

One example of integrator structure is shown in FIG. 5A. Each integrator IT1 to IT5 comprises an adder S7 with two positive inputs, a delay circuit UD1 clocked by the clock signal of frequency Fs and performing the function 1/z in the field z, and a multiplier M1 which output forms the output O1 of the integrator. The input I1 is connected to an input of the adder S7 which other input is connected to the output O1 of the integrator. The output of the adder is applied to the delay circuit UD1 which output is applied to an input of the multiplier M1. The other input of the multiplier M is connected to the input I2 of the integrator.

As shown in FIG. 5A, the integrator of highest rank IT5 also comprises an output O2 supplying a signal /RST for resetting the integrators IT1 to IT4 of lower rank. To that end the output of the delay circuit UD1 is applied to a module ABS1 which output supplies the absolute value (value without sign) of the signal that the circuit UD1 supplies. The output of the module ABS1 is applied to the input of a threshold detector R01 made here in the form of hysteresis relay. The output of the relay R01 forms the output O2 of the integrator and supplies the signal /RST. When the signal passing through the integrator IT5 reaches a determined saturation threshold, the threshold detector R01 places the signal/RST at 0.

In FIG. 4, the output O2 of the integrator IT5 is thus connected to the inputs I2 of the integrators IT1 to IT4 as well as to the input I2 of the integrator IT5. The fact that the signal /RST goes to 0 causes the resetting of the multipliers M1 present in the integrators IT1-IT4 (FIG. 5A) and consequently resets the outputs O1 of the integrators. So as to manage the saturation without clipping of the signal, the integrators IT1-IT5 and the adders S1-S5 preferably operate on a digital scale of N2 bits higher than the number of bits N1 of the input signal IS, for example 24 bits if the input signal is coded on 16 bits.

The delta-sigma modulator 4 shown in FIG. 4 also comprises feed-forward loops SZ0 and feed-backward loops SZ1, SZ2 linking the delta-sigma stages. In this embodiment, the loops SZ0 comprise a gain unit SA0 receiving the input signal IS and which output sends the signal IS to a second positive input of the adder S6, to a second positive input of the adder S5, to a second positive input of the adder S4, to a positive input of the adder SS1 which output is linked to a second positive input of the adder S3 and to a second positive input of the adder S2. The loop SZ1 comprises a gain unit SA1 which input is linked to the output of the gain unit g51 and which output is linked to a second positive input of the adder SS1. The loop SZ2 comprises a gain unit SA2 which output is linked to a second positive input of the adder S1.

Still in FIG. 4, the converter ADC is clocked by a clock signal which frequency Fc is at least twice superior to the sampling frequency Fs. The digital filters are clocked by the same clock signal of frequency Fc and their outputs are subsampled by means of sample-hold circuits SH1, SH2, SH3 operating at the frequency Fs.

The quantifier QT1 may be a 1-bit quantifier conventionally supplying an output signal equal to +1 or −1. According to an optional but advantageous aspect of the first improvement, the quantifier QT1 has several output levels and supplies a quantified signal QS coded on N3 bits. A driver circuit DCT1 is in this case provided between the quantifier QT1 and the power circuit PA to supply to the latter adapted control signals from the multilevel quantified signal.

An example embodiment QT11 of a multilevel quantifier is shown in FIG. 5B. In this example, the quantifier has 5 output levels −1, −0.5, 0, +0.5, +1 in positive and negative values, i.e. 2 levels different of 0 in absolute value, 0.5 and 1. The quantifier is asynchronous and comprises 4 threshold detectors R21, R22, R23, R24 in the form of hysteresis relays (to avoid the oscillations in output around the threshold values) having respective detection thresholds of ¾, ¼, −¼, −¾, where "1" is considered here, for simplicity reasons, as the full scale value of the signal NSS supplied by the delta-sigma stage DS5. The inputs of the relays are connected to the input (IN) of the quantifier. The output of each relay goes to 1 when the signal received by the input of the relay (here the signal NSS) is higher than the value of the detection threshold thereof. The outputs of the relays are applied to an adder MS1 with four inputs which output is divided by 4 by means of a gain unit having a gain of ¼, the output of the gain unit forming the output (OUT) of the quantifier QT11.

In one embodiment, the quantifier supplies a thermometer code, for example coded as follows:

| Input | Thermometer coded output |
|---|---|
| IN > 3/4 → OUT = 1 | 1111 |
| 3/4 > IN > 1/4 → OUT = 0.5 | 0111 |
| 1/4 > IN > −1/4 → OUT = 0 | 0011 |
| −1/4 > IN > −3/4 → OUT = −0.5 | 0001 |
| IN < −3/4 → OUT = −1 | 0000 |

In this case, it can be noted that N3, the number of bits of the coding of QS, is also equal to the number of quantification thresholds used (R21, R22, R23 and R24).

According to an optional but advantageous aspect of the first improvement, the driver circuit DCT1 which receives the multilevel quantified signal QS is a RTZ converter RM1 (where RTZ is the acronym for "Return To Zero" used to refer to a signal returning to zero). The converter RM1 supplies a signal RTZS1 comprising pulses passing by zero and having a variable duty cycle which is function of the value of the quantified signal. In FIG. 4, the converter RM1 receives on an input I1 the signal NSS supplied by the delta-sigma stage DS5 and on an input I2 the quantified signal QS.

An embodiment RM10 of the converter RM1 is shown in FIG. 6. This embodiment is provided to be associated to the quantifier with 5 output levels shown in FIG. 5B.

The converter RM10 comprises a threshold detector R02 in the form of hysteresis relay, an absolute value module ABS2, a multiplexer MUX1, a decoder DEC1, a RTZ signal generator RGEN1 receiving a signal of frequency 2Fs, and a multiplier MT0. The relay R02 here has a detection threshold equal to 0. Its input forms the input I2 of the converter RM10 and thus receives the signal NSS. Its output supplies a signal SIGN applied to an input of the multiplier MT0. The signal SIGN is equal to +1 when the signal NSS is positive and −1 when the signal NSS is negative. The generator RGEN1 is a frequency divider logic circuit which supplies a RTZ signal RS(1/2) having a duty cycle of 0.5. The multiplexer MUX1 comprises three inputs respectively receiving the logic "0", the signal RS(1/2) and the logic "1". The logic "1" corresponds to a RTZ signal having a duty cycle of 1 (i.e. a signal continuously at 1) and the logic "0" corresponds to a RTZ signal having a duty cycle equal to zero (i.e. continuously equal to 0).

The output of the multiplexer MUX1 copies one of the inputs of the multiplexer and supplies a signal RS which is applied to a second input of the multiplier MT. The signal RS is a signal NRZ having a duty cycle equal to zero if the logic 0 is selected by the multiplexer, a duty cycle of 0.5 if the signal RS(1/2) is selected, or of 1 if the logic "1" is selected. The selection of the input of the multiplexer is performed by the decoder DEC1 which receives the absolute value |QS| of the quantified signal, supplied by the module ABS2. Thus, the duty cycle of the signal RS is function of the value of |QS|. At the output of the multiplier MT0, the signal RTZS1 is identical to the signal RS except for the polarity, and has a negative value when the signal SIGN is equal to −1.

As shown by chronograms in FIGS. 7A and 7B, the signal RTZS1 has a duty cycle equal to zero when |QS| is equal to 0, a duty cycle equal to 0.5 when |QS| is equal to 0.5 and a duty cycle equal to 1 when |QS| is equal to 1 (the full scale of the quantified signal being also brought to 1 as far as the quantified signal is concerned).

It is generally admitted that the use of a "coarse" quantified signal only having two quantification levels +1 and −1 and which therefore generates a significant quantification noise is compensated by the shaping function of the delta-sigma modulator, in association with a high oversampling frequency Fs, which rejects a great part of the quantification noise outside the useful band. Nevertheless, the use of a multilevel quantified signal such as that which has just been described, in combination with the noise shaping (which integrates here, in addition to the quantification noise, the non-idealities present in the output signal OS supplied by the power circuit PA) contributes to obtaining an amplifier offering high performances in terms of signal to noise ratio and total harmonic distortion.

The signal RTZS1 thus obtained, which duty cycle modulations reflect the different values of the multilevel quantified signal, is applied to the power circuit PA which is configured to transform the signal RTZS1 into an output signal OS modulated in pulse width and having three voltage levels +Vcc and −Vcc and 0.

FIG. 8A schematically shows an example embodiment of the power circuit PA. The circuit PA comprises here a power circuit PA1 in a single ended configuration, generally called "half-bridge". The stage PA1 comprises for example two MOSFET power transistors in series, according to the mounting called "totem pole", where the output node is taken from between the two transistors. These power transistors are generally oversized and occupy a significant surface in a semiconductor chip. They are driven by signals SW1, SW2 supplied by an adaptation logic circuit ADCT1 receiving the signal RTZS1. The conversion of the signal RTZS1 into an output signal OS is made in accordance with the following table, which is also shown in FIG. 9A:

| RTZS 1 | | |
|---|---|---|
| SIGN | RS | OS |
| +1 | 1 | Vcc |
| +1 | 0 | 0 V |
| −1 | 1 | −Vcc |
| −1 | 0 | 0 V |

This conversion is a conversion in voltage only (1 being converted into +Vcc and −1 into −Vcc) and the variations edges of the output signal OS are identical to the variation edges of the signal RTZS1, so that the signal OS has the same duty cycle as the signal RTZS1.

FIG. 8B schematically shows another example embodiment of the power circuit PA. The circuit PA here comprises two power stages PA1, PA2 arranged in balanced mode, this mounting being generally called "full bridge". Each power circuit PA1, PA2 comprises for example two MOSFET transistors in "totem pole", and is driven by signals SW3, SW4, respectively SW5, SW6, supplied by an adaptation logic circuit ADCT2 receiving the signal RTZS1. The stage PA1 supplies an output signal OS1 to a first terminal of the load LD and the stage PA2 supplies an output signal OS2 to a second terminal of the load LD. In the end, the load sees between its two terminals a resulting signal OS=OS1−OS2. The conversion of the signal RTZS1 into output signals OS1, OS2 is made in accordance with the following table, which is also shown in FIG. 9B:

| RTZS1 | | | | |
|---|---|---|---|---|
| SIGN | RS | OS1 | OS2 | OS |
| +1 | 1 | Vcc | 0 V | +Vcc |
| +1 | 0 | 0 V | 0 V | 0V |
| −1 | 1 | 0 V | Vcc | −Vcc |
| −1 | 0 | Vcc | Vcc | 0 V |

As previously, the variations of the output signal OS are the image of the variations of the signal RTZS1, so that the signal OS has the same duty cycle variations as the signal RTZS1.

When the signal OS is balanced, i.e. formed by the difference between the two output signals OS1, OS2, sending the signal OS into the state loop SL1 or the state loops SL1 and SL2 or SL1, SL2 and SL3 of the delta-sigma modulator may be performed by means of two filters LPF1a, LPF1b instead of the single filter LPF1 previously described, as shown in FIG. 8B. Each filter LPF1a, LPF1b is referenced to the ground of the circuitry and performs filtering one of the output signals OS1, OS2. The filters LPF1a, LPF1b supply analog signals FOSa, FOSb which are applied to an analog differential amplifier ADIF which output supplies the signal FOS applied to the analog to digital converter ADC.

In addition to the advantages previously indicated relating to the provision of a multilevel quantifier, the control in modulation RTZ of the power circuit PA offers the advantage of substantially improving its efficiency. An efficiency of around 95 to 99% may be aimed instead of the 90% generally obtained with an output signal OS which varies between the two extremes +Vcc and −Vcc without using modulation value equal to zero.

It will be clear to those skilled in the art that amplifiers according to the first improvement of the disclosure are susceptible of various other embodiments. The delta-sigma modulator may generally be designed at the order M, where M is at least equal to three, and the number of delta-sigma stages of lower rank implied in the shaping of non-idealities of the output signal OS is not necessarily limited to 1, 2 or 3 delta-sigma stages. The designer, in the light of the teaching disclosed, will define the final architecture of the amplifier as a function of the target specifications and performances.

Figures 10, 11:
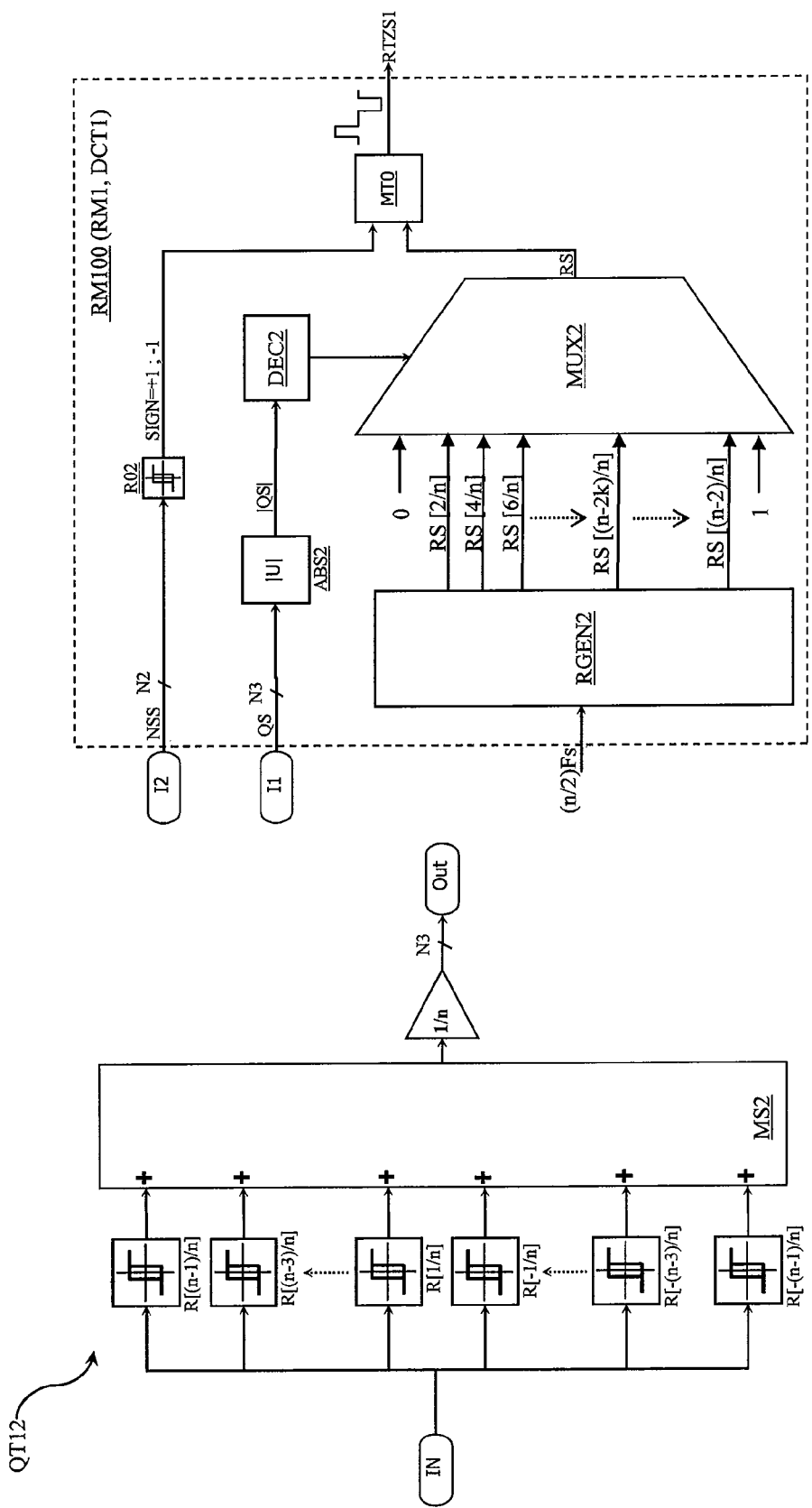
FIG. 10 shows an example embodiment of a quantifier with multiple output levels.
FIG. 11 shows an example embodiment of a RTZ converter with multiple modulation levels.

Also, the multilevel quantifier may be made at the order "n", n referring to the number of detection thresholds of the quantifier, corresponding to the number of threshold detectors used in the embodiment shown in FIG. 5B. As an example, FIG. 10 shows a quantifier QT12 having "n" detection thresholds, where "n" is here an even number (an odd number of thresholds may also be provided). The quantifier thus comprises "n" relays referred to as "R(threshold)" having respective switching thresholds of −(n−1)/n, −(n−3)/n, . . . , −1/n, 1/n, . . . , (n−3)/n, (n−1)/n. The quantifier supplies a signal QS having n+1 levels. It may also be noted that N3=n in the embodiment using a thermometer code.

In association with such a quantifier with n detection thresholds and n+1 output values, a RTZ converter RM100 having n+1 duty cycles is provided, such as shown in FIG. 11. The converter RM100 differs from the converter RM10 previously described in that it comprises a signal generator RGEN2 mounted in frequency divider receiving a signal of frequency nFs/2. The generator RGEN2 supplies signals RTZ referred to as "RS(duty cycle)" in FIG. 11 and having duty cycles equal to 2/n, 4/n, 6/n, . . . , (n−2 k)/n, . . . , (n−2)/n. Also, the multiplexer MUX1 is replaced by a multiplexer MUX2 having a number of inputs sufficient to select one of these various signals RTZ, as well as a decoder DEC2 to drive the multiplexer from the signal QS with n+1 levels. In addition to these signals RTZ, the multiplexer MUX2 receives the value 1, forming a duty cycle signal equal to 1, as well as the value 0, forming a duty cycle signal equal to zero.

Second Improvement

As it has been indicated in the preamble, it is known to make an audio codec comprising, on the same semiconductor chip, one or more amplifiers, analog to digital converters, and signal process processors or DSP to convert into amplifiable audio signals digital audio data received or read in compressed or coded form and vice-versa. To simplify the structure of an audio codec, the analog to digital converter ADC present in the amplifier according to the first improvement of the disclosure is advantageously integrated into at least one second data path when the amplifier is not used, so as to be used for other tasks.

FIG. 12 is a partial view of an example embodiment of an audio codec AC1 comprising the amplifier A4 previously described (FIG. 2C). The audio codec AC1 comprises, in addition to the amplifier A4, processors DSP1, DSP2, an analog multiplexer AMUX controlled by a selection signal C1 and having at least two inputs E1, E2 and an output S1, and a digital demultiplexer DMUX controlled by a selection signal C2 and having an input E1 and at least two outputs S1, S2. The processor DSP1 supplies the signal IS to the amplifier A4 from an audio signal Rx, for example a signal received or read in a digital audio support (MP3 file, CD, DVD, etc.). The input E1 of the multiplexer AMUX is linked to the output of the filter LPF1 of the amplifier A4 and thus receives the signal FOS when the amplifier is active. The input E2 of the multiplexer AMUX is linked to a source of an external audio signal ES through an anti-aliasing filter AAF. The source of the external audio signal ES is for example a microphone MC. The output S1 of the multiplexer AMUX is linked to the input of the analog to digital converter ADC and the output of the converter ADC is applied to the input E1 of the demultiplexer DMUX. The output S1 of the demultiplexer DMUX is applied to the input of the digital filters DF1, DF2, DF3 of the state loops SL1, SL2, SL3 of the amplifier A4. The output S2 of the demultiplexer DMUX is linked to a port of the processor DSP2. The selection signals C1, C2 allows the inputs E1, E2 of the multiplexer AMUX and the outputs S1, S2 of the demultiplexer DMUX to be selected as follows:

1) when the amplifier A4 is active, the input E1 of the multiplexer AMUX is selected and the output S1 of the demultiplexer DMUX is selected. The signal FOS is thus applied to the converter ADC and the digital signal DFOS supplied by the converter ADC is applied to the digital filters DF1, DF2, DF3 of the amplifier A4. It thus operates as if the elements AMUX and DMUX were not present.

2) when the amplifier A4 is not used, the input E2 of the multiplexer AMUX is selected and the output S2 of the demultiplexer DMUX is selected. The signal ES is thus applied to the converter ADC which supplies a digital external signal DES, which is sent to the processor DSP2 for processing, for example compression or saving. The processor DSP2 may also send the signal DES to another amplifier embedded into the same semiconductor substrate (not shown).

The converter ADC may therefore be used by two different applications, on the one hand as element of the amplifier A4 and on the other hand as conventional converter allowing external audio signals to be digitized. FIG. 12 is only a partial view of an audio codec which may be made according to the second improvement of the disclosure. By juxtaposing several structures similar to that which is shown in this figure, at each time there is at least one analog to digital converter to digitize an external signal and at least one amplifier to amplify an internal audio signal or the external audio signal digitized by the converter of another amplifier present in the audio codec.

FIG. 13 is another example of audio codec here made with the amplifier A8 previously described (FIG. 3C). The amplifier A8 differs from the amplifier A4 in that the low-pass filter LPF2 arranged between the power circuit is used as low-pass filter in the state loops SL1, SL2, SL3 of the amplifier A8. Thus, the filtered analog signal FOS such as applied to the load LD is directly applied to the input E1 of the multiplexer AMUX.

Those skilled in the art will note that this second improvement according to the disclosure is, due to its very nature, independent of the first improvement. It may indeed be implemented with any type of amplifier including an analog to digital converter, for example the amplifier described by the U.S. Pat. No. 6,373,334, which is incorporated by reference herein in its entirety.

Third Improvement

Here, the quantification noise in a digital modulator is concerned, still in relation with the improvement of the performances of a digital amplifier. It is known that the quantification noise is a constant which not only depends on the quantification step q, called quantum. It comes that the ratio between the quantification noise and the signal is all the more significant as the signal is low. Nonlinear quantification techniques such as the semilogarithmic quantification allow the quantification step to vary as a function of the signal intensity, the semilogarithmic quantification step being all the smaller as the signal intensity is low. Such techniques may however be complex to implement and it may be desired to decrease the signal to noise ratio in another way. It will be noted that this aim is independent of the noise shaping by a delta-sigma modulator. Indeed the noise shaping significantly reduces the signal to noise ratio for a given quantification noise but the result obtained nevertheless depends on the initial quantification noise. In other words, it may be desired to reduce the intrinsic signal to noise ration of the quantifier in addition to the positive effects of the noise shaping, which will be all the more efficient if the initial signal to noise ratio is improved.

An idea on which the present third improvement is based is to increase the amplitude of the signal when it is low, so that the ratio between this signal and the quantification noise is lower. Very schematically, if the amplitude of the signal is equal to X and the amplitude of the noise is equal to N, the fact of applying a gain G to the amplitude of the signal makes it possible to obtain a signal to noise ratio equal to GX/N i.e. X/(N/G) instead of X/N. It amounts to dividing by G the quantification noise. It comes therefore to do the inverse of what nonlinear quantification techniques provide: increase the amplitude of the signal of low amplitude instead of decreasing the quantification step of the signal of low amplitude.

Figure 14A:
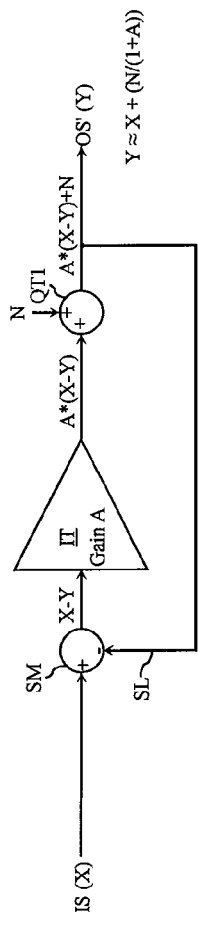
FIG. 14A is the diagram of a conventional digital delta-sigma modulator and FIG. 14B the diagram of an embodiment of a delta-sigma modulator according to the third improvement of the disclosure.

FIG. 14A is the schematic diagram of an elementary delta-sigma modulator of order 1 comprising an adder SM receiving an input signal IS(X) of amplitude X on a positive input, an integrator IT of gain A and a quantifier QT1 supplying an output signal OS'(Y) of amplitude Y. The quantifier QT1 is conventionally modeled in the form of adder receiving on a first positive input the signal supplied by the integrator IT and on a second positive input a noise N representing the quantification noise.

The signal OS' is sent to a negative input of the adder SM by means of a state loop SL for the shaping of the quantification noise N. It is assumed here and conventionally that the gain A of the integrator IT is high (this gain may be generated by gain units of the adder, as previously described).

According to an approximation allowing the target technique effect to be illustrated, the amplitudes X and Y are linked by the following relationship:

$$Y=A(X-Y)+N \quad (1)$$

i.e.:

$$Y(1+A)=AX+N \quad (2)$$

i.e.:

$$Y=X(A/(1+A))+N/(1+A) \quad (3)$$

As A is big in relation to 1:

$$Y \approx X+N/(1+A) \quad (4)$$

The intrinsic value of the noise (i.e. without taking into account the noise shaping) is therefore equal to $N/(1+A)$, where N is a constant which is only function of the quantification step.

Figure 14B:
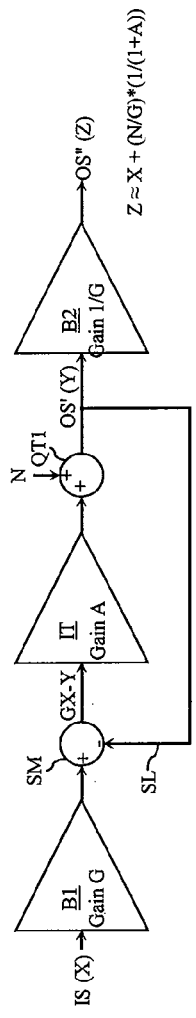

FIG. 14B shows the same elementary delta-sigma modulator, to which a gain unit B1 having a gain G, and a gain unit B2 having a gain 1/G are added. The gain unit B1 is inserted between the application point of the input signal IS(X) and the input of the adder SM. The gain unit B2 is arranged at the output of the quantifier QT1, after the feedback node where the state loop SL is connected. The signal on the feedback node is referred to as OS'(Y) and has an amplitude Y. The signal at the output of the gain unit B2 is referred to as OS" and has an amplitude Z. According to the same approximation as previously, it may be written:

$$Y=A(GX-Y)+N \quad (5)$$

i.e.:

$$Y(1+A)=GAX+N \quad (6)$$

i.e.:

$$Y=X(GA/(1+A))+N/(1+A) \quad (7)$$

The amplitude Z of the signal OS" at the output of the unit B2 is therefore:

$$Z=Y/G=X(A/(1+A))+N/(G(1+A)) \quad (8)$$

As A is big in relation to 1:

$$Z \approx X+N/G(1+A) \quad (9)$$

If the relationship (9) is compared to the relationship (4), it can be seen that the insertion of the gain units B1 and B2 into the delta-sigma modulator allows the intrinsic noise of the modulator to be decreased by G, which is equal to $N/(G(1+A))$ instead of $N/(1+A)$, without modifying the global gain of the modulator. This relationship is in practice usable only for a small amplitude X, at the risk of saturating the modulator. It is thus provided, according to the present third improvement, to apply the gain G to the input signal when it is of low value, for example ⅕ of its peak value, and to simultaneously apply the gain 1/G to the output signal.

It is to be noted that this technique is applicable to any type of digital modulator forming a source of constant noise N. The relationships (5) to (9) may be recalculated in the case of a digital modulator without state loop, Y=AGX+N is then directly found, i.e., at the output of the unit B2, Z=Y/G=AX+N/G.

Figure 15:
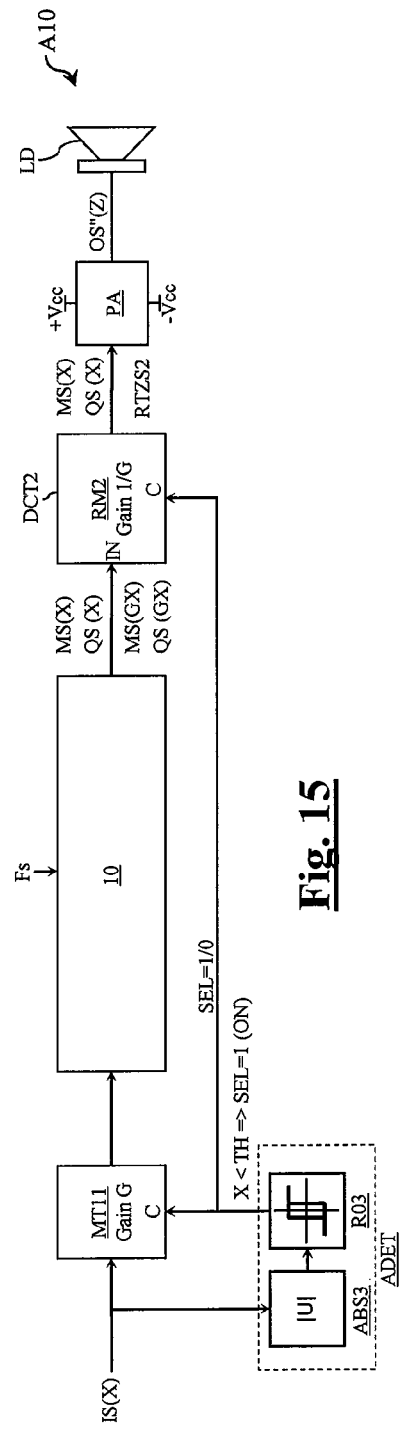
FIG. 15 shows an embodiment of an amplifier according to the third improvement of the disclosure.

FIG. 15 shows an embodiment of an amplifier A10 according to the third improvement.

The amplifier A10 comprises from its input up to its output a gain unit MT11 receiving the input signal IS(X) of amplitude X, a digital modulator 10 clocked by the sampling clock signal of frequency Fs already described, a gain unit DCT2, the power circuit PA already described, supplying here an output signal referred to as OS"(Z) with reference to FIG. 14B. The signal OS" is applied to the load LD. The gain unit DCT2 is here a driver circuit which controls the power circuit PA.

The gain unit MT11 and the driver circuit DCT2 comprise each a control input C receiving a signal SEL having two possible values ON and OFF, for example 1 and 0. The signal SEL is supplied by a circuit ADET for monitoring the amplitude of the input signal. The circuit ADET comprises for example a module of absolute value ABS3 and a threshold detector R03 in the form of hysteresis relay. The module ABS3 receives the signal IS(X) and supplies its absolute value to the detector R03. The detector R03 places the signal SEL at 1 (ON) when the absolute value of the signal IS is lower than a threshold TH representing for example ⅕ of the full scale of the input signal.

When the signal SEL is equal to 0 (OFF), the gain unit MT11 transfers the input signal IS(X) to the modulator 10 without modifying its amplitude. The modulator 10 thus supplies a digital modulated signal MS(X) of amplitude X. The driver circuit DCT2 receives the signal MS(X) and transfers it to the power circuit PA.

When the input signal IS is of low amplitude, the signal SEL goes to 1 (ON). The gain unit MT11 transfers to the modulator 10 the input signal IS by applying thereto a gain G, and thus supplies a signal which amplitude is equal to GX. The modulator 10 thus supplies a digital modulated signal MS(X) of amplitude GX. The driver circuit DCT2 receives the signal MS(GX) and transfers it to the power circuit PA by dividing its amplitude GX by G, to restore the original amplitude X of the input signal. As indicated above, the noise N present in the output signal OS" supplied by the power circuit PA is then divided by G.

Figure 1B:
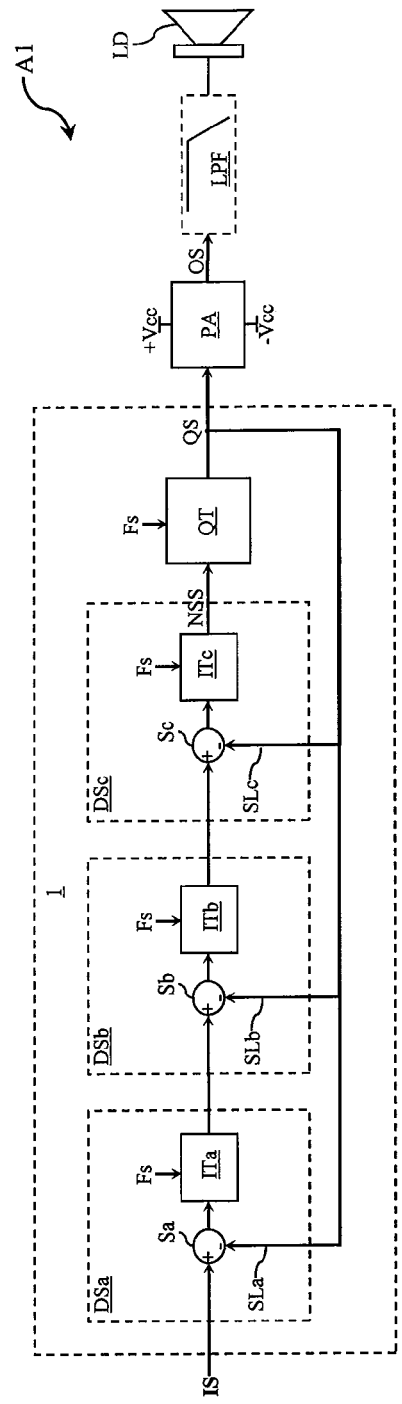

It is to be noted here that the amplitude X of the digital modulated signal MS is not the amplitude of the signals which form the signal MS but the amplitude of the signal IS(X) which modulated signal MS represents the coded form. For example, the modulator 10 may be one of the delta-sigma modulators 2, 3, 4, 5, 6, 7, 8 previously described in relation with FIGS. 2A to 4, or the conventional delta-sigma modulator 1 shown in FIG. 1. In this case the modulated signal MS is a quantified signal QS, i.e. a pulse density modulated signal (PDM).

As shown in FIG. 16, the gain unit MT11 is for example made by means of a multiplexer having an input ON1 receiving the input signal IS through a module having a gain G and an input ON2 directly receiving the signal IS, the multiplexer being controlled by the signal SEL.

In one embodiment of the amplifier A10, the digital modulator 10 is a delta-sigma modulator supplying the quantified signal QS(X), and the driver circuit DCT2 is a RTZ converter RM2 which applies the gain 1/G by supplying to the power circuit a signal RTZS2 which duty cycle is decreased by G. It is considered hereinafter that the gain G is a low integer value, for example equal to 2, 3 or 4. Various embodiments of the converter RM2 may be considered.

FIRST EXAMPLE

In this example, the quantified signal QS is a two-state signal +1 and −1. In this case, the converter RM2 is active when the signal SEL is equal to 1 (ON). When the signal SEL is equal to 0 (OFF), the converter is transparent and transfers the quantified signal QS(X) to the power circuit PA.

An embodiment RM20 of the converter RM2 is shown in FIG. 17. The converter comprises an input IN receiving the quantified signal QS, the input C receiving the signal SEL, a RTZ generator RGEN3, a multiplexer MUXS1, and a multiplier MT1 having an input linked to the input IN, an input linked to the output of the multiplexer MUXS1 and supplying the signal RTZS2. The generator RGEN3 is a frequency divider logic circuit receiving a signal of frequency 2GFs and which supplies a RTZ signal RS(1/G) having a duty cycle of 1/G. The multiplexer MUXS1 receives the signal RS(1/G) on an input and the logic value 1 on a second input. The multiplexer MUXS1 is driven by the signal SEL and its output supplies a signal RS' which is equal to 1 when SEL is equal to 0 (OFF) and equal to RS(1/G) when SEL is equal to 1 (ON).

The operation of the converter RM20 is shown by the chronograms of FIGS. 18A to 18C. FIG. 18A shows variations of the signal QS, arbitrarily chosen. FIG. 18B shows the corresponding variations of the signal RTZS2 when SEL=0 (OFF). FIG. 18C shows the corresponding variations of the signal RTZS2 when SEL=1 (ON). When SEL=0 the signal RTZS2 is the image of the quantified signal. When SEL=1, the signal RTZS2 has a duty cycle equal to 1/G and thus carries in coded form (pulse width modulation) a signal which amplitude is divided by G in relation to that of the signal carried in coded form by the quantified signal QS.

SECOND EXAMPLE

In this example, the quantified signal QS is a multilevel signal. When the signal SEL is equal to 0 (OFF), the converter RM2 converts the quantified signal QS(X) into RTZ signals having a variable duty cycle by associating to each value of QS a corresponding value having a duty cycle comprised between 0 and 1, as it has been previously described in relation with FIGS. 6 and 11. When the signal SEL is equal to 1 (ON), the converter converts the quantified signal QS(X) into RTZ signals having a variable duty cycle by associating to each value of QS a value of duty cycle which is equal to the corresponding duty cycle when SEL=0 divided by G.

One embodiment RM21 of the converter RM2 is shown in FIG. 19 in the case where the signal QS has 3 quantification levels in absolute value including the value zero, and a total of 5 quantification levels.

The converter RM21 comprises a threshold detector R04 in the form of hysteresis relay, an absolute value module ABS4, two multiplexers MUXON, MUXOFF, a decoder DEC3, a multiplexer MUXS2, a RTZ signal generator RGEN4 receiving here a signal of frequency 4Fs, and a multiplier MT2. The relay R02 has a detection threshold equal to 0. Its input receives the signal QS or the signal NSS previously described, supplied by the delta-sigma stage DS5. The output of the relay R04 supplies the signal SIGN already described which is applied to an input of the multiplier MT2. The signal SIGN is equal to +1 when the signal QS is positive and −1 when the signal QS is negative.

The generator RGEN4 is a frequency divider logic circuit which supplies RTZ signals RS(1/2) and RS(1/4) having a duty cycle of 0.5 and 0.25, respectively. The multiplexer MUXOFF comprises three inputs respectively receiving the logic "0", the signal RS(1/2) and the logic "1". The multiplexer MUXON comprises three inputs respectively receiving the logic "0", the signal RS(1/4) and the signal RS(1/2). The multiplexer MUXOFF supplies a signal RSa and the multiplexer MUXON supplies a signal RSb. The signals RSa, RSb are applied to inputs of the multiplexer MUXS2 which selects the signal RSa or the signal RSb to apply it to a second input of the multiplier MT2. The multiplexer MUXS2 is controlled by the signal SEL and selects the signal RSa when SEL=0 (OFF) and the signal RSb when SEL=1 (ON). The two multiplexers MUXOFF and MUXON select one of the signals they receive on their inputs as a function of the signal value |QS|, under the effect of the decoder DEC3 which receives the signal |QS| supplied by the module ABS4.

The signal RSa is a signal NRZ having a duty cycle equal to zero if the logic 0 is selected by the multiplexer, a duty cycle of 0.5 if the signal RS(1/2) is selected, or a duty cycle of 1 if the logic "1" is selected. The signal RSb is a signal NRZ having a duty cycle equal to zero if the logic 0 is selected by the multiplexer, a duty cycle of 0.25 if the signal RS(1/4) is selected, or of 0.5 if the signal RS(1/2) is selected.

FIG. 20A is a chronogram showing variations of the signal QS, arbitrarily chosen. FIG. 20B is a chronogram showing the variations of the signal RTZS2 when SEL=0 (i.e. RTZS2=RSa). FIG. 20C is a chronogram showing the variations of the signal RTZS2 when SEL=1 (i.e. RTZS2=RSb). The duty cycle of the signal RTZS2 is equal to zero when |QS|=0, is equal to 0.5 when |QS|=0.5 and SEL=0, is equal to 0.25 when |QS|=0.5 and SEL=1, is equal to 1 when |QS|=1 and SEL=0, and is equal to 0.5 when |QS|=1 and SEL=1.

Figure 21:
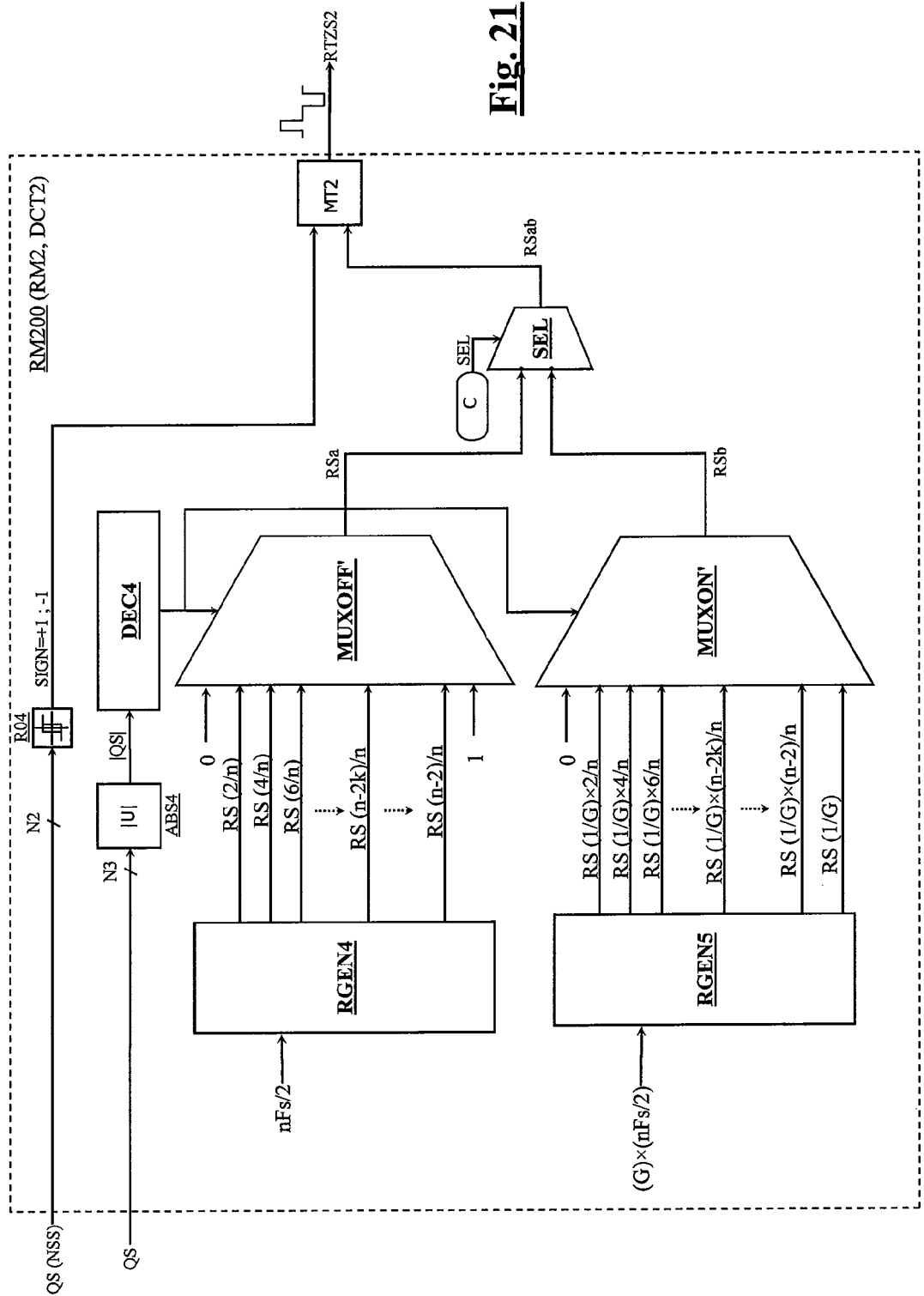
FIG. 21 shows another embodiment of a variable gain converter RTZ shown in block form in FIG. 15.

FIG. 21 shows an embodiment RM200 extended to the order n, where n is even, of the converter which has just been described, where n is the number of detection thresholds of the quantifier. The converter RM200 converts into RTZ signal, as a function of the signal SEL, a quantified signal QS having n+1 levels supplied by a quantifier such as that shown in FIG. 10. The multiplexers MUXOFF and MUXON are replaced by multiplexers MUXOFF' and MUXON' with multiple inputs which are controlled by a decoder DEC4 which replaces the decoder DEC3. A signal generator RGEN4 is provided to supply to the multiplexer MUXOFF' RTZ signals having duty cyles of 2/n, 4/n, 6/n, ..., (n−2 k)/n, ..., (n−2)/n from a signal of frequency nFs/2. The multiplexer MUXOFF' also receives the values 0 and 1 to supply signals of duty cycles of 0 and 1, respectively. A signal generator RGEN5 is provided to supply to the multiplexer MUXOFF' RTZ signals having duty cyles of (1/G)(2/n), (1/G)(4/n), ..., (1/G)(n−2 k)/n, ..., (1/G) (n−2)/n and 1/G from a signal of frequency G(nFs)/2. The multiplexer MUXON' also receives the value 0 to supply a RTZ signal of duty cycle equal to zero.

Figure 22:
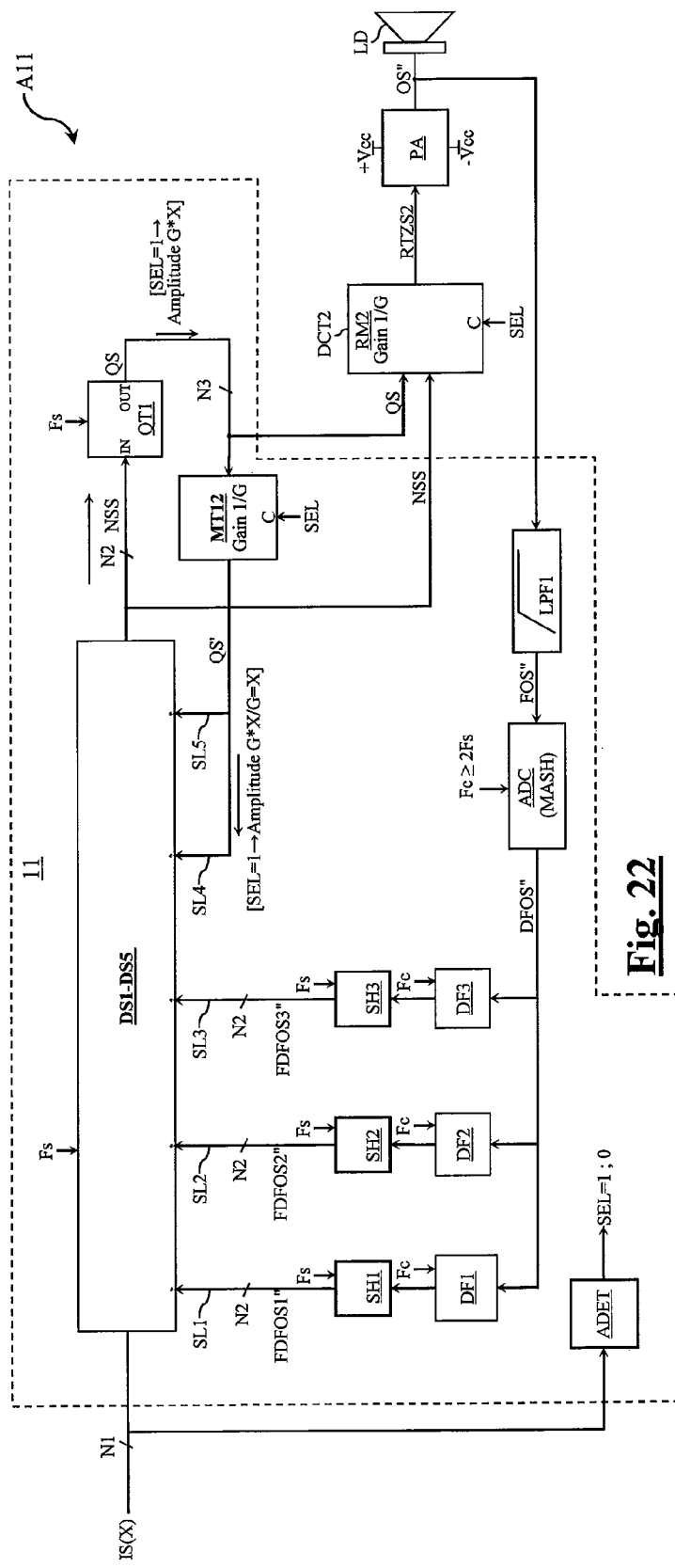
FIG. 22 shows an embodiment of an amplifier implementing the first and third improvements of the disclosure.

It will be clear to those skilled in the art that the improvements which have been described are susceptible of various other embodiments. The improvements described may be combined or not. To focus the ideas on the combination possibilities and the variations of the improvements described, FIG. 22 shows an amplifier A11 which implements the first improvement and a variation of the third improvement. The general structure of the amplifier A11 is similar to the amplifier A4 which has been described above in relation with FIG. 4. There are also the elements LPF1, ADC, DF1 to DF3, SH1 to SH3, the quantifier QT1, and the delta-sigma stages DS1-DS5, here shown in block form. In application of the third improvement, the level detector ADET is provided to monitor the input signal IS(X) and supply the signal SEL which activates the application of the gain G. The gain G is here not applied to the input signal by means of the gain unit MT11 as in the embodiment shown in FIG. 15. Here, a gain unit MT12 having a gain of 1/G is arranged in the state loops of higher rank SL4, SL5. The gain unit MT12 receives the quantified signal QS and supplies to the state loops SL4, SL5 a quantified signal QS' carrying in coded form (PDM modulation) a feedback signal which amplitude is divided by G when the signal SEL is equal to 1 (ON). When the signal SEL is equal to 0, the quantified signal QS is sent into the state loops SL4, SL5 by the gain unit MT12 without modifying its amplitude. When the signal SEL=1, the signal NSS the quantifier receives has its amplitude multiplied by the gain G, under the effect of the feedback of the signal which amplitude is divided by G. Thus, the quantified signal QS carries in the form of pulse density modulated signal (the amplitude of the pulses may be of multilevel type or not) a signal which amplitude is equal to GX instead of X.

In addition the driver circuit DCT1 shown in FIG. 4 is here replaced by the driver circuit DCT2 previously described, which applies the inverse gain 1/G to the signal it supplies to the power circuit PA when SEL=1 (ON). In one embodiment, the circuit DCT2 is the modulator RM2 supplying the signal RTZS2 previously described, having a duty cycle which is divided by G when SEL=1. The embodiments RM20, RM21, RM200 previously described in relation with FIGS. 17, 19 and 21 are applicable to the amplifier A11, the choice of the adapted embodiment being function of the number of levels that the quantified signal QS has.

Embodiments of amplifiers according to the first or third improvements of the disclosure are in addition susceptible of various applications other than audio applications, for example for controlling motors, controlling switches, and generally any application requiring to use a digital control power circuit supplying an output signal having good characteristics in terms of SNR and THD.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An amplifier device for receiving a digital input signal, and comprising:
    a digital delta-sigma modulator comprising M delta-sigma stages each comprising a state loop, where M is at least equal to 3, a quantifier receiving a signal supplied by a delta-sigma stage and supplying a quantified signal, and state loops to send state signals to adders of the delta-sigma stages,
    a power circuit to supply to an electric load an output signal which is function of the quantified signal, and
    N state loops of a first type configured to send the output signal to the adders of N delta-sigma stages of lower rank, where N is at least equal to 1, each state loop of the first type including:
        an analog low-pass filter for filtering the output signal and supplying a filtered output signal, and
        an analog to digital converter for converting the filtered output signal into digital filtered output signal, and supplying to the adders of the N delta-sigma stages of lower rank a digital filtered output signal including non-idealities of the output signal.

2. The Amplifier device according to claim 1, wherein the analog low-pass filter and the analog to digital converter are common to all the state loops of the first type.

3. The Amplifier device according to claim 1, also comprising, between the analog to digital converter and the N delta-sigma stages of lower rank, at least one digital filter for filtering the digital filtered output signal and supplying to the adders of the N delta-sigma stages of lower rank a filtered digital filtered output signal including non-idealities of the output signal.

4. The Amplifier device according to claim 3, comprising a digital filter common to all the state loops of the first type.

5. The Amplifier device according to claim 3, wherein each state loop of the first type comprises a dedicated digital filter.

6. The Amplifier device according to claim 3, wherein the digital filter is a low-pass filter having a cut-off frequency at −3 dB at least twice higher than the cut-off frequency at −3 dB of the analog low-pass filter.

7. The Amplifier device according to claim 3, wherein the digital filter is a high-pass filter.

8. The Amplifier device according to claim 3, wherein the digital filter comprises a combination of a low-pass filter and a high-pass filter.

9. The Amplifier device according to claim 1, also comprising M-N state loops of a second type configured to send the quantified signal to the adders of M-N delta-sigma stages of higher rank.

10. The Amplifier device according to claim 1, comprising nonlinear stabilization elements arranged in all or part of the delta-sigma stages and configured to prevent saturation in amplitude of the delta-sigma modulator.

11. The Amplifier device according to claim 1, wherein the analog low-pass filter has a cut-off frequency at −3 dB around 5 to 10 times the cut-off frequency at −3 dB of the input signal.

12. The Amplifier device according to claim 1, wherein the power circuit is configured to be linked to the load without interposing an analog low-pass filter, and the analog low-pass filter of the state loops of the first type is arranged between the load and the analog to digital converter.

13. The Amplifier device according to claim 12, wherein the analog low-pass filter has electrical features which simulate the impedance of the load seen from the power circuit.

14. The Amplifier device according to claim 1, wherein the analog low-pass filter is arranged between the power circuit and the load.

15. The Amplifier device according to claim 1, wherein the delta-sigma modulator receives the input signal coded on N1 bits and operates on N2 bits, where N2 is greater than N1.

16. The Amplifier device according to claim 1, comprising a RTZ converter receiving the quantified signal and supplying to the power circuit a control signal coded RTZ which duty cycle is a function of the amplitude of the quantified signal.

17. The Amplifier device according to claim 1, wherein the power circuit is a D-class amplifier with a balanced or unbalanced configuration.

18. The Amplifier device according to claim 1, comprising means for, when the amplitude is lower than a threshold,
    applying a gain to the signal supplied to the quantifier so as to increase the ratio between this signal and a quantification noise, and
    applying an inverse gain upstream from the quantifier, so that the global gain of the amplifier device is unchanged.

19. A device, comprising:
    an amplifier device embedded in a semiconductor chip, the amplifier device including:
        a digital delta-sigma modulator comprising M delta-sigma stages each comprising a state loop, where M is at least equal to 3, a quantifier receiving a signal supplied by a delta-sigma stage and supplying a quantified signal to send state signals to adders of the delta-sigma stages, a power circuit to supply to an electric load an output signal which is function of the quantified signal, and N state loops of a first type configured to send the output signal to the adders of N delta-sigma stages of lower rank, where N is at least equal to 1, each state loop of the first type including:

an analog low-pass filter for filtering the output signal and supplying a filtered output signal, and an analog to digital converter for converting the filtered output signal into digital filtered output signal, and supplying to the adders of the N delta-sigma stages of lower rank a digital filtered output signal including non-idealities of the output signal.

20. Audio codec comprising:

an amplifier device that includes:

a digital delta-sigma modulator comprising M delta-sigma stages each comprising a state loop, where M is at least equal to 3, a quantifier receiving a signal supplied by a delta-sigma stage and supplying a quantified signal to send state signals to adders of the delta-sigma stages, a power circuit to supply to an electric load an output signal which is function of the quantified signal, and N state loops of a first type configured to send the output signal to the adders of N delta-sigma stages of lower rank, where N is at least equal to 1, each state loop of the first type including:

an analog low-pass filter for filtering the output signal and supplying a filtered output signal, and an analog to digital converter for converting the filtered output signal into digital filtered output signal, and supplying to the adders of the N delta-sigma stages of lower rank a digital filtered output signal including non-idealities of the output signal, a first selection circuit having a first input configured to receive the filtered output signal, at least one second input configured to receive an external signal, and one output linked to the input of the analog to digital converter of the amplifier device, the output of the first selection circuit being connected to the first or second input of the first selection circuit as a function of a control signal applied to the first selection circuit, and a second selection circuit having an input linked to the output of the analog to digital converter, a first output linked to the amplifier device, and at least one second output, the first or the second output of the second selection circuit being connected to the input of the second selection circuit as a function of a control signal applied to the second selection circuit.

* * * * *